United States Patent [19]

Suda et al.

[11] Patent Number: 5,325,176
[45] Date of Patent: Jun. 28, 1994

[54] POSITION DETECTING METHOD AND APPARATUS INCLUDING FRAUNHOFER DIFFRACTION DETECTOR

[75] Inventors: Shigeyuki Suda; Kenji Saitoh, both of Yokohama; Masakazu Matsugu, Atsugi; Naoto Abe, Isehara; Minoru Yoshii, Tokyo; Ryo Kuroda, Atsugi, all of Japan

[73] Assignee: Canon Kabushiki Kaisha, Tokyo, Japan

[21] Appl. No.: 875,601

[22] Filed: Apr. 28, 1992

Related U.S. Application Data

[63] Continuation of Ser. No. 758,398, Sep. 4, 1991, abandoned, which is a continuation of Ser. No. 625,698, Dec. 12, 1990, abandoned, which is a continuation of Ser. No. 310,625, Feb. 15, 1989, abandoned.

[30] Foreign Application Priority Data

Feb. 16, 1988 [JP] Japan .................. 63-033207
Sep. 6, 1988 [JP] Japan .................. 53-225807

[51] Int. Cl.⁵ .............................................. G01B 11/02
[52] U.S. Cl. ................................... 356/356; 356/355; 356/400; 356/401
[58] Field of Search ............... 356/355, 356, 400, 401

[56] References Cited

U.S. PATENT DOCUMENTS

| | | | |
|---|---|---|---|
| 4,037,969 | 7/1977 | Feldman et al. | 356/172 |
| 4,211,489 | 7/1980 | Kleinknecht et al. | 356/400 |
| 4,311,389 | 1/1982 | Fay et al. | 356/354 |
| 4,326,805 | 4/1982 | Feldman et al. | 356/399 |
| 4,360,273 | 11/1982 | Thaxter | 356/354 |
| 4,371,264 | 2/1983 | Lacombat et al. | 356/356 |
| 4,398,824 | 8/1983 | Feldman et al. | 356/401 |
| 4,514,858 | 4/1985 | Novak | 378/34 |
| 4,545,683 | 10/1985 | Markle | 356/400 |
| 4,631,416 | 12/1986 | Trutna, Jr. | 250/548 |
| 4,704,033 | 11/1987 | Fay et al. | 356/363 |
| 4,771,180 | 9/1988 | Nomura et al. | 250/548 |
| 4,815,854 | 3/1989 | Tanaka et al. | 356/356 |
| 4,835,078 | 5/1989 | Harvey et al. | 430/394 |
| 5,160,848 | 11/1992 | Saitoh et al. | 356/401 |

FOREIGN PATENT DOCUMENTS

| | | |
|---|---|---|
| 0243520 | 11/1987 | European Pat. Off. |
| 2598797 | 11/1987 | France . |
| 157033 | 12/1981 | Japan . |
| 86722 | 4/1987 | Japan . |
| 128120 | 6/1987 | Japan . |
| 165918 | 7/1987 | Japan . |
| 255804 | 11/1987 | Japan . |
| 255805 | 11/1987 | Japan . |
| 2073950 | 10/1981 | United Kingdom . |

OTHER PUBLICATIONS

Feldman, et al., "Application of Zone Plates to Alignment in X-ray Lithography," Optical Engineering, vol. 22, No. 2, Mar. 1983, pp. 203–207.

Hutley, "Nonspectroscopic Uses of Diffraction Gratings", Diffraction Gratings, (1982), pp. 293–313 and 318–325.

*Primary Examiner*—Davis L. Willis
*Assistant Examiner*—LaCharles P. Kessee, II
*Attorney, Agent, or Firm*—Fitzpatrick, Cella, Harper & Scinto

[57] ABSTRACT

A device usable with a first object and a second object at least one of which is provided with a diffraction grating, for detecting the position of the second object relative to the first object, is disclosed. The device includes a light source for projecting a position detecting beam upon the first object; a beam detecting portion for receiving the position detecting beam after it is directed from the first object and being incident on the second object, the beam detecting portion receiving the position detecting beam to detect the position of the second object relative to the first object; wherein at least one diffraction grating is disposed in the path of the position detecting beam to be received by the beam detecting portion, which diffraction grating is effective to diffract the position detecting beam at least twice and wherein the beam detecting portion is disposed at a site effective not to receive unwanted diffraction light produced from the or at least one diffraction grating.

40 Claims, 30 Drawing Sheets

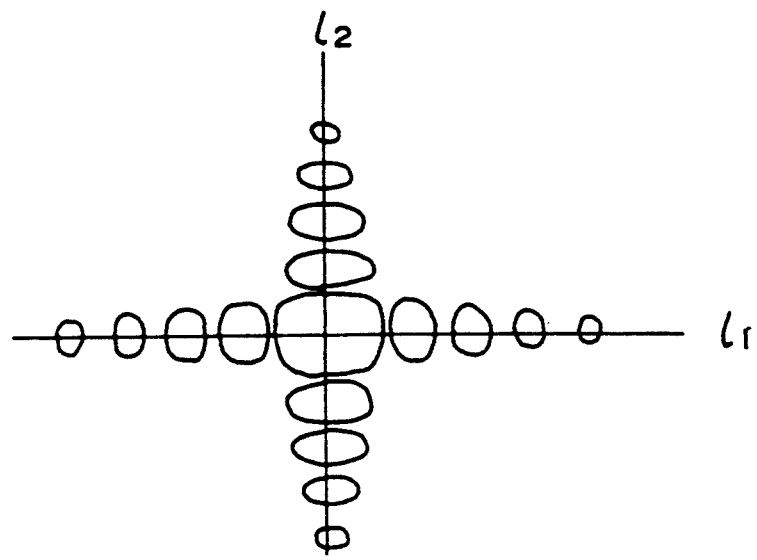
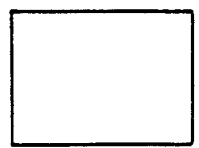
APERTURE
SHAPE
F I G. 5

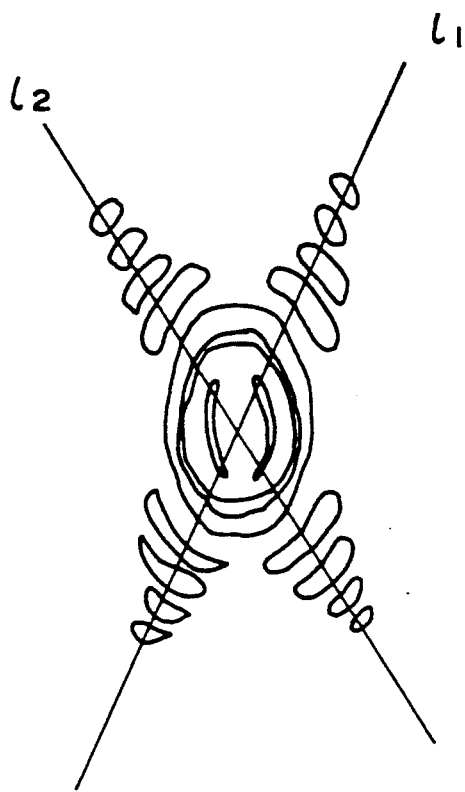
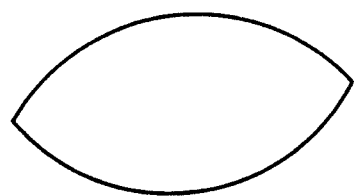
APERTURE
SHAPE
F I G. 6

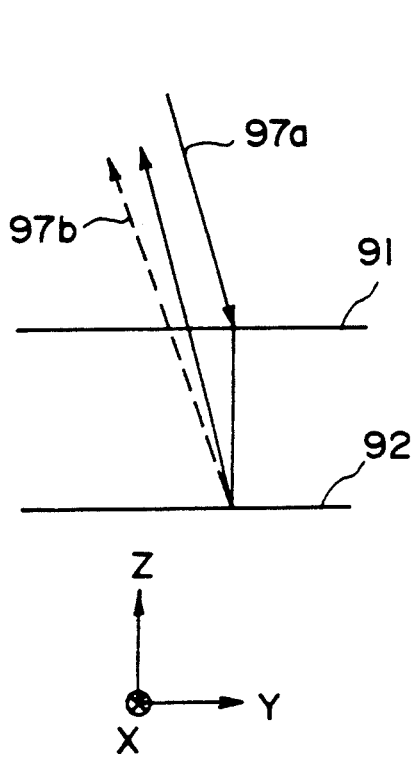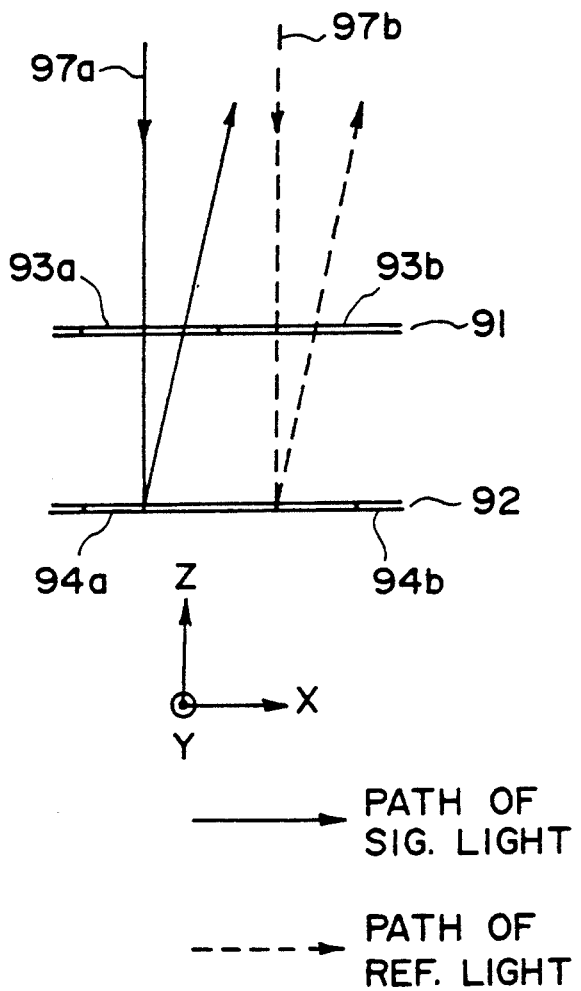
FIG. 18A
FIG. 18B

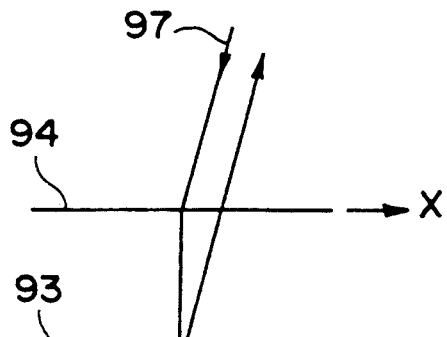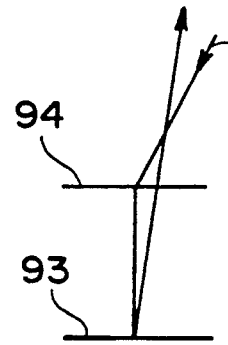
FIG. 19A    FIG. 19B
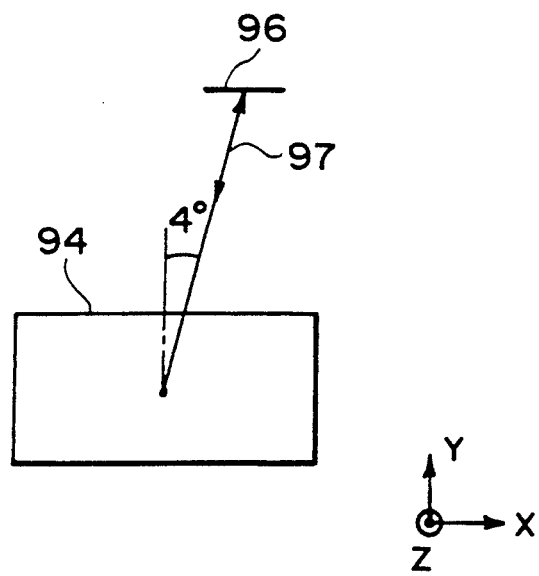
FIG. 19C

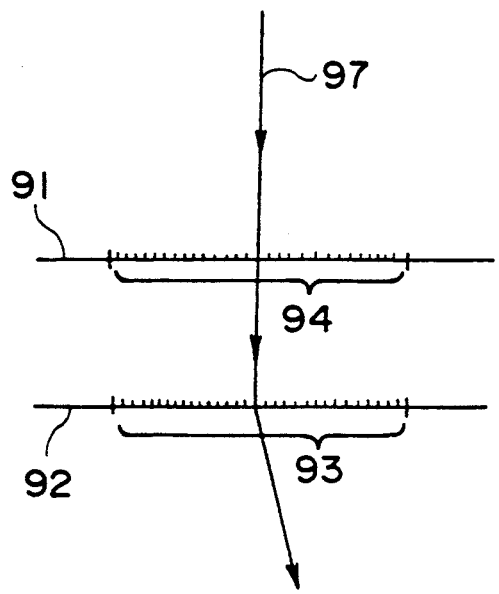
F I G. 21A
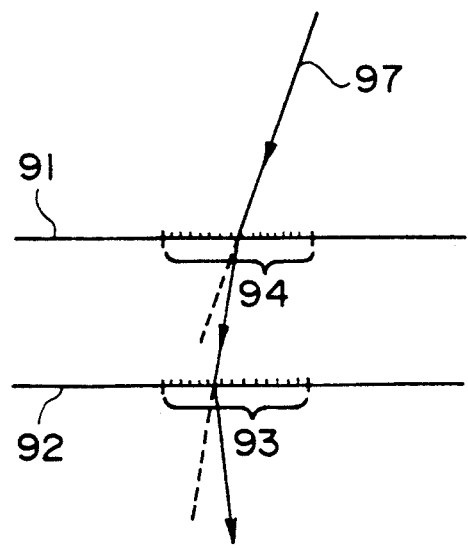
F I G. 21B

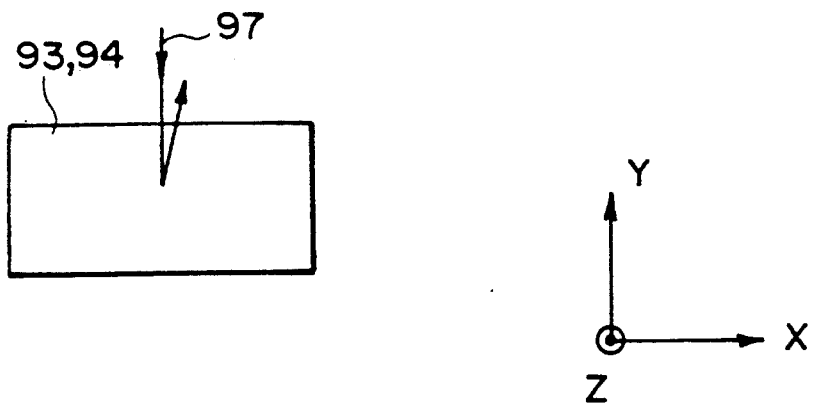
F I G. 21C
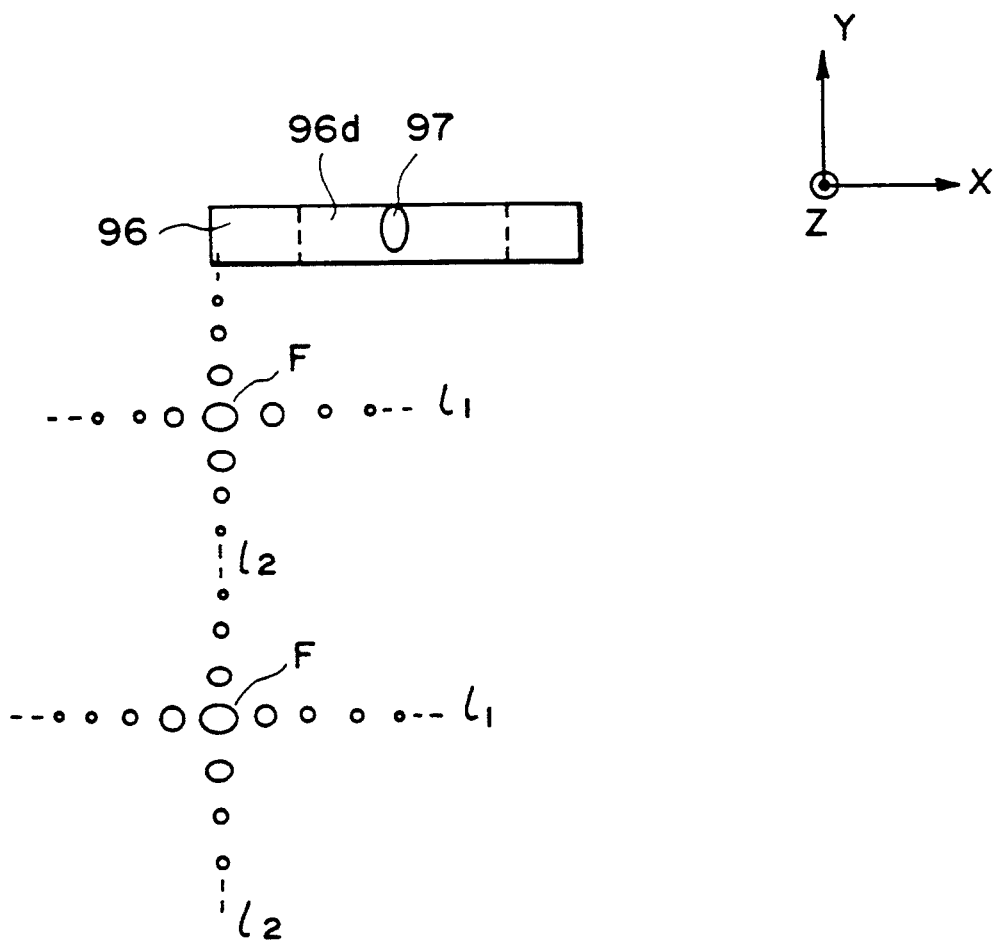
F I G. 21D

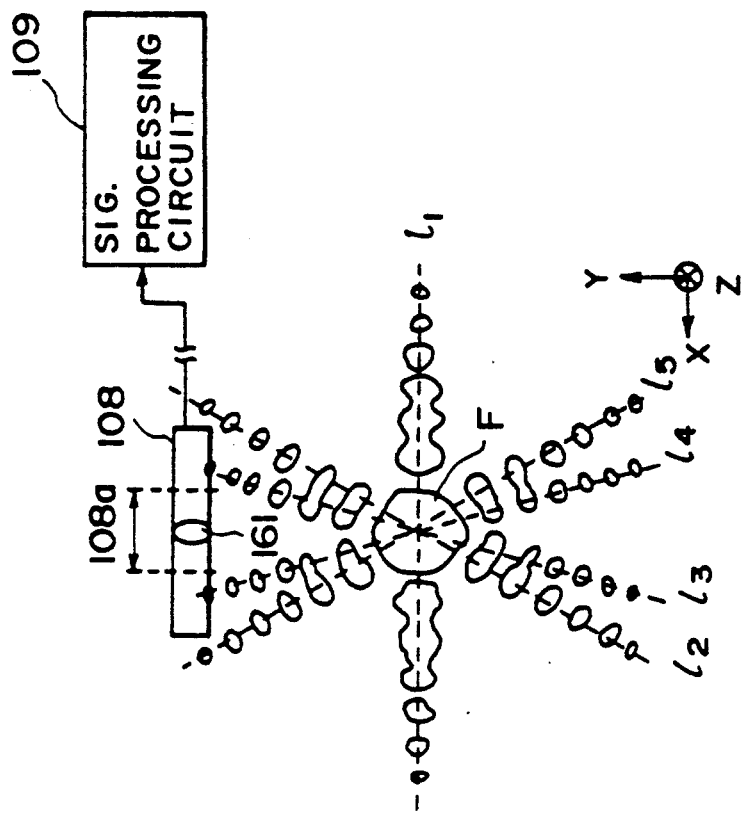
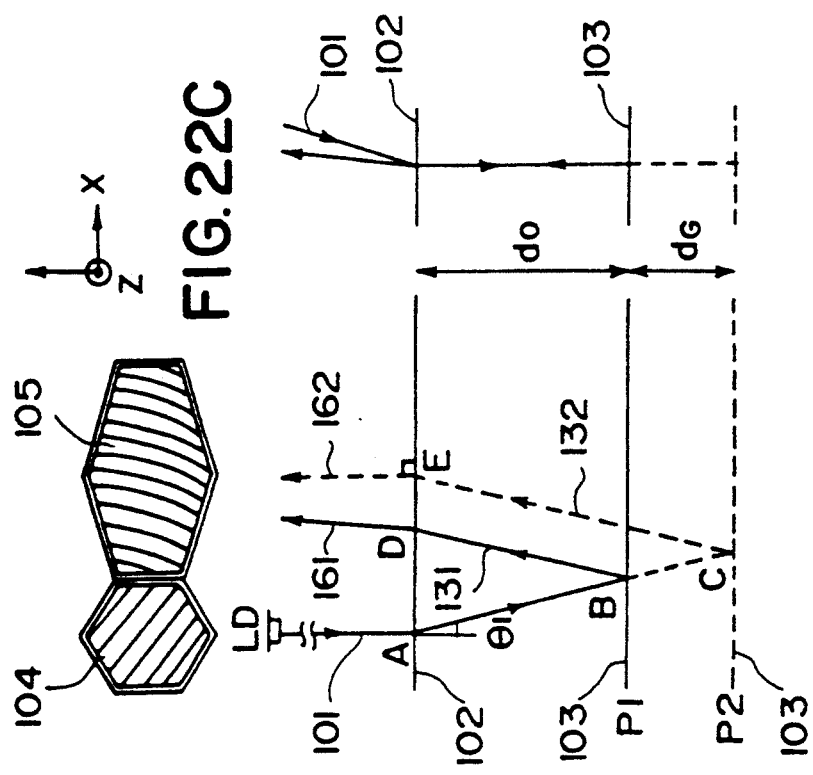
FIG. 22D
FIG. 22C
FIG. 22B
FIG. 22A

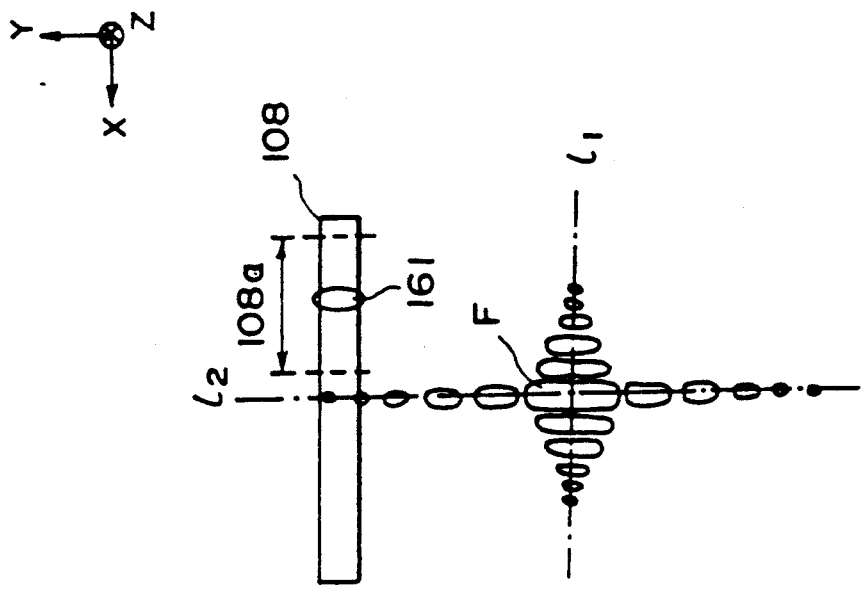
FIG. 23D
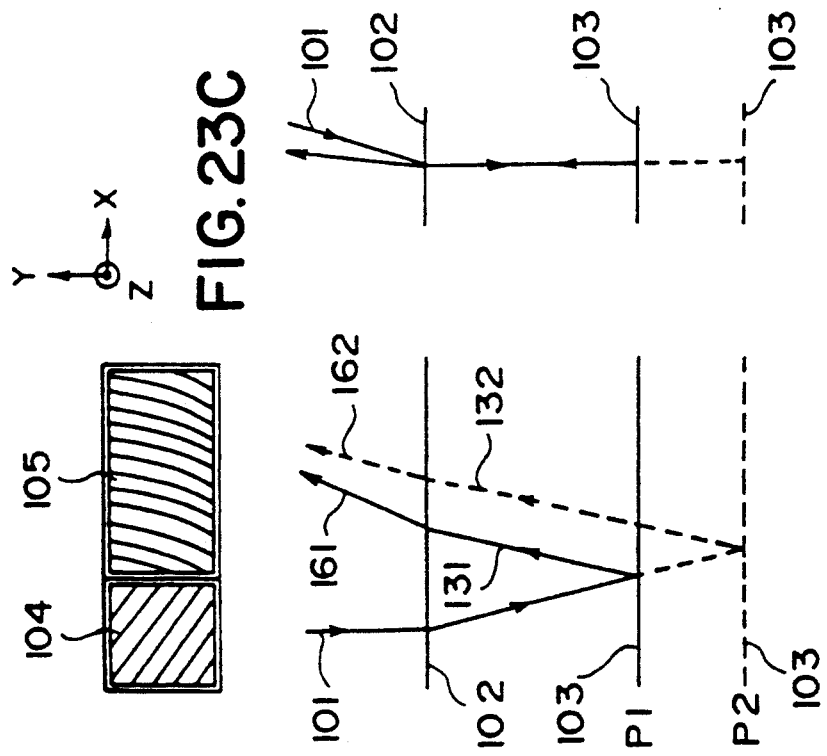
FIG. 23C
FIG. 23B
FIG. 23A

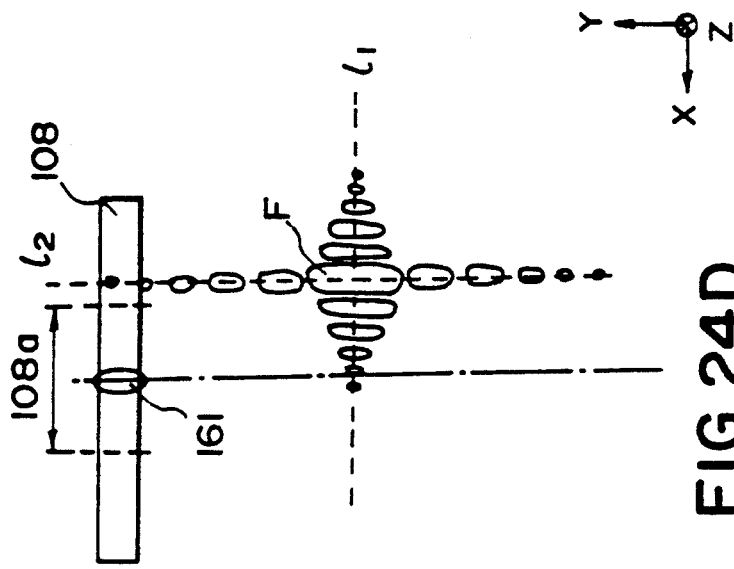
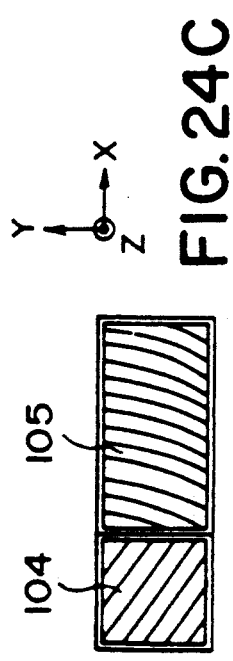
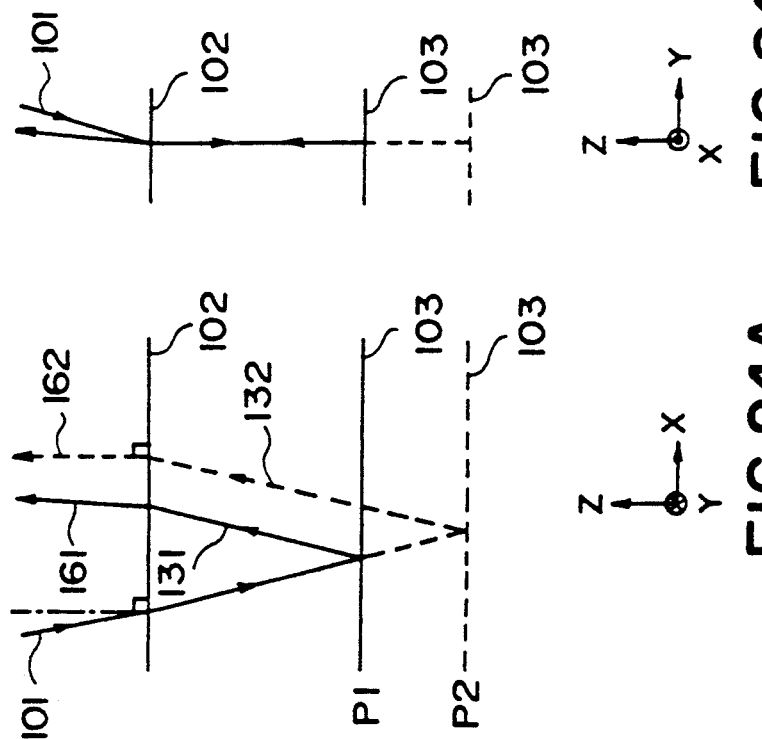
FIG.24D
FIG.24C
FIG.24B
FIG.24A

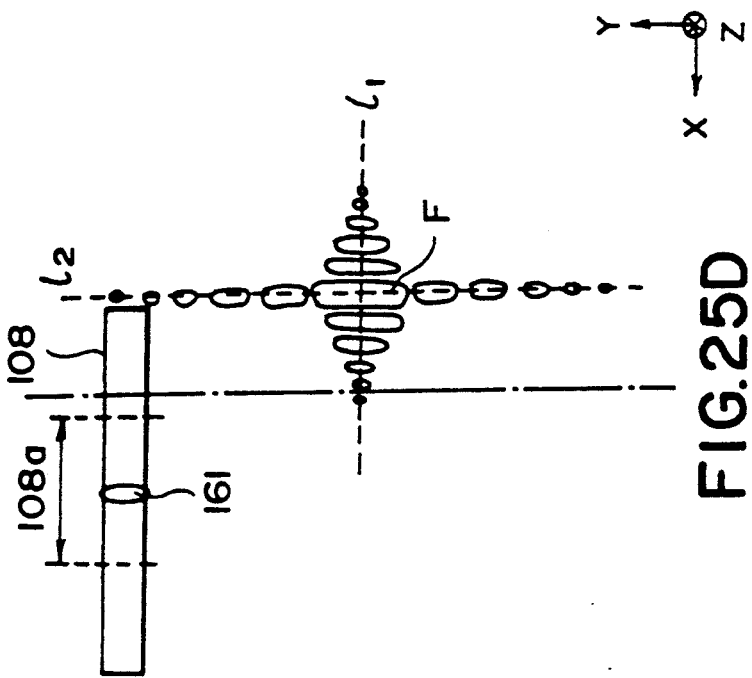
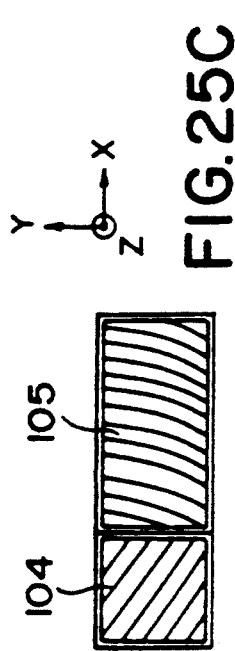
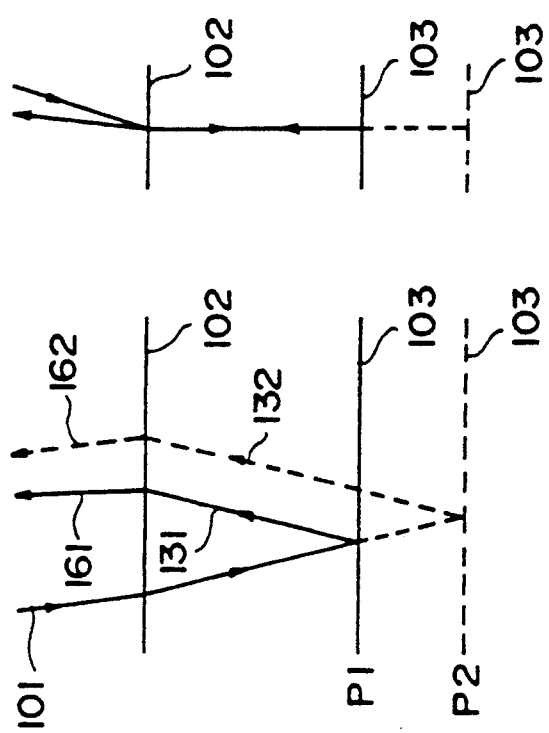
FIG.25D
FIG.25C
FIG.25B
FIG.25A

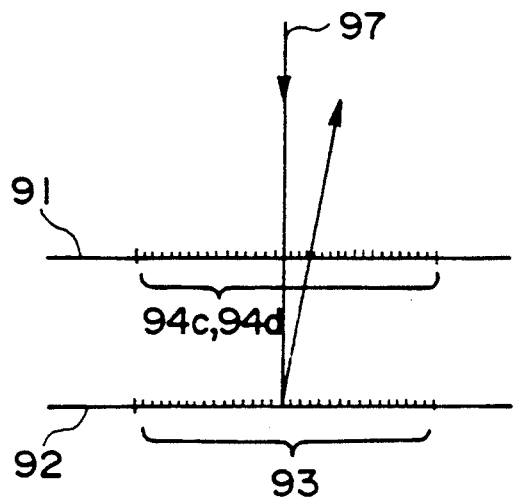
F I G. 28A
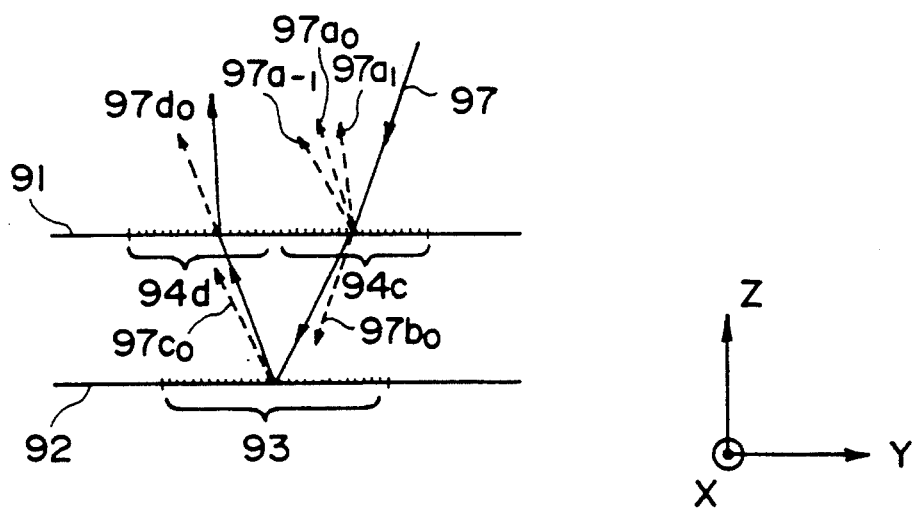
F I G. 28B

POSITION DETECTING METHOD AND APPARATUS INCLUDING FRAUNHOFER DIFFRACTION DETECTOR

This application is a continuation of prior application, Ser. No. 07/758,398 filed Sep. 4, 1991, which application is a continuation of prior application, Ser. No. 07/625,698 filed Dec. 12, 1990, which application is a continuation of prior application, Ser. No. 07/310,625 filed Feb. 15, 1989, all now abandoned.

FIELD OF THE INVENTION AND RELATED

This invention relates generally to an alignment system for correctly positioning an object. More particularly, the invention is concerned with position detecting method and apparatus suitably usable in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for relatively positioning or aligning the mask and the wafer.

In exposure apparatuses for use in the manufacture of semiconductor devices, the relative alignment of a mask and a wafer is one important factor in respect to ensuring improved performance. Particularly, as for alignment systems employed in recent exposure apparatuses, submicron alignment accuracies or more strict accuracies are required in consideration of the demand for higher degree of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, as an example there is a method wherein the amount of relative deviation of these alignment patterns is detected on the basis of image processing. Another method is proposed in U.S. Pat. No. 4,037,969 and Japanese Laid-Open Patent Application, Laid-Open No. Sho 56-157033, wherein so-called zone plates are used as alignment patterns upon which light is projected and wherein the positions of light spots formed on a predetermined plane by lights from the illuminated zone plates are detected.

Generally, an alignment method utilizing a zone plate is relatively insensitive to any defect of an alignment pattern and therefore assures relatively high alignment accuracies, as compared with an alignment method simply using a traditional alignment pattern.

FIG. 1 is a schematic view of a known type alignment system utilizing zone plates.

In FIG. 1, a parallel light emanating from a light source 72 passes through a half mirror 74 and is focused at a point 78 by a condensing lens 76. Thereafter, the light illuminates a mask alignment pattern 68a on a mask 68 and an alignment pattern 60a on a wafer 60 which is placed on a support table 62. Each of these alignment patterns 68a and 60a is provided by a reflection type zone plate and functions to form a spot of focused light on a plane perpendicular to an optical axis which contains the point 78. The amount of relative deviation of the positions of these light spots formed on that plane is detected, by directing the focused beams to a detection plane 82 by means of the condensing lens 76 and another lens 80.

In accordance with an output signal from the detector 82, a control circuit 84 actuates a driving circuit 64 to relatively align the mask 68 and the wafer 60.

FIG. 2 illustrates an imaging relationship of lights from the mask alignment pattern 68a and the wafer alignment pattern 60a shown in FIG. 1.

In FIG. 2, a portion of the light divergently advancing from the point 78 is reflectively diffracted by the mask alignment pattern 68a and forms a spot 78a of focused light at or adjacent to the point 78, the spot representing the mask position. Another portion of the light passes through the mask 68 in the form of a zero-th order transmission light and is projected upon the wafer alignment pattern 60a on the wafer 60 surface with its wavefront being unchanged. The incident light is reflectively diffracted by the wafer alignment pattern 60a and then passes again through the mask 68 in the form of a zero-th order transmission light, and finally is focused in the neighborhood of the point 78 to form a spot 78b of focused light, representing the wafer position. In the illustrated example, when the light diffracted by the wafer 60 forms a spot, the mask 68 functions merely as a transparent member.

The position of the spot 78b formed by the wafer alignment pattern 60a in the described manner represents a deviation $\Delta\sigma'$, in the plane perpendicular to the optical axis containing the point 78, of an amount corresponding to the amount of deviation $\Delta\sigma$ of the wafer 60 with respect to the mask 68.

In the alignment system shown in FIG. 2, for detection of any relative positional deviation, the lights from the zone plates provided on the mask and the wafer are imaged, independently of each other, upon a predetermined plane on which the evaluation is to be made, and any positional error of each imaging point from a reference position is detected.

SUMMARY OF THE INVENTION

The inventors of the subject application have found a specific problem peculiar to such an alignment method. Namely, when a diffraction grating such as a Fresnel zone plate is used as an alignment pattern for the position detection, there is produced a Fraunhofer image (side lobe) around a signal light in accordance with the peripheral shape (aperture shape) of the used diffraction grating. There is a high possibility that such a side lobe is mixed into the signal light and is incident on a light receiving sensor provided for the position detection, and therefore, it leads to an error in the detection of a focus point upon the light receiving sensor. If this occurs, the measurement precision is deteriorated disadvantageously.

It is an object of the present invention to provide a position detecting method and apparatus which is arranged to avoid entry of any Fraunhofer diffraction image into a light receiving means provided to detect a light that bears correct positional information concerning an article whose position is to be detected, to thereby ensure high-precision position detection on the basis of detected information.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5 and 6 are schematic representations for explicating the interrelationship between the aperture shape of a diffraction grating and a Fraunhofer diffraction image.

FIGS. 18A and 18B are schematic views showing a major portion of a sixth embodiment of the present invention.

FIGS. 19A, 19B, 19C and 19D are schematic views, respectively, for explicating a major portion of a seventh embodiment of the present invention.

FIGS. 21A–21D are schematic representations, respectively, for explicating a major portion of a ninth embodiment of, the present invention.

FIGS. 22A, 22B, 22C and 22D are explanatory views of a major portion a tenth embodiment of the present invention.

FIGS. 23A, 23B, 23C and 23D are explanatory views of a major portion of an eleventh embodiment of the present invention.

FIGS. 24A, 24B, 24C and 24D are explanatory views of a major portion of a twelfth embodiment of the present invention.

FIGS. 25A, 25B, 25C and 25D are explanatory views of a major portion of a thirteenth embodiment of the present invention.

FIGS. 28A, 28B, 28C and 28D are schematic representations, respectively, explicating a major portion of a sixteenth embodiment of the present invention.

DESCRIPTION OF THE PREFERRED EMBODIMENTS

Briefly, in accordance with one aspect of the present invention, at least one of a first and second objects is provided with one or more diffraction gratings such as, for example, a Fresnel zone plate, a grating element formed by rectilinear patterns of regular intervals, etc. Such a light as having been diffracted, at least twice, by such a diffraction grating is used as a signal light. Signal detecting portion for receiving such a signal light is provided at a specific position to evade an unwanted diffraction light produced by one or more diffraction gratings. Thus, it is possible to avoid or reduce an error in the detected information, whereby high-precision positional error measurement (i.e. detection of the amount of positional deviation, the direction of positional deviation, and the like) is ensured.

More particularly, in some embodiments which will be described below, a light detecting portion is disposed at a site which is outside a plane in which Fraunhofer diffraction vectors lie.

Referring now to FIG. 3, the Fraunhofer diffraction vectors will be explained in detail. The Fraunhofer diffraction vectors are the vectors of a Fraunhofer diffraction image as produced when light is projected upon a diffraction grating having a predetermined aperture shape, the vectors being taken with respect to the direction of emission from the diffraction grating.

Assuming now that a diffraction grating is formed at an aperture having a finite number of vertexes and considering a spherical surface S (hereinafter "observation spherical surface") which has an origin at the center coordinate of the diffraction grating and which has a sufficiently large radius r as compared with the size of the aperture, as the Fraunhofer diffraction vectors, those vectors F which intersect upon the spherical surface with a center line or lines (which will be described later) of a Fraunhofer diffraction light distribution as observed on this spherical surface, are defined.

Figure 1:
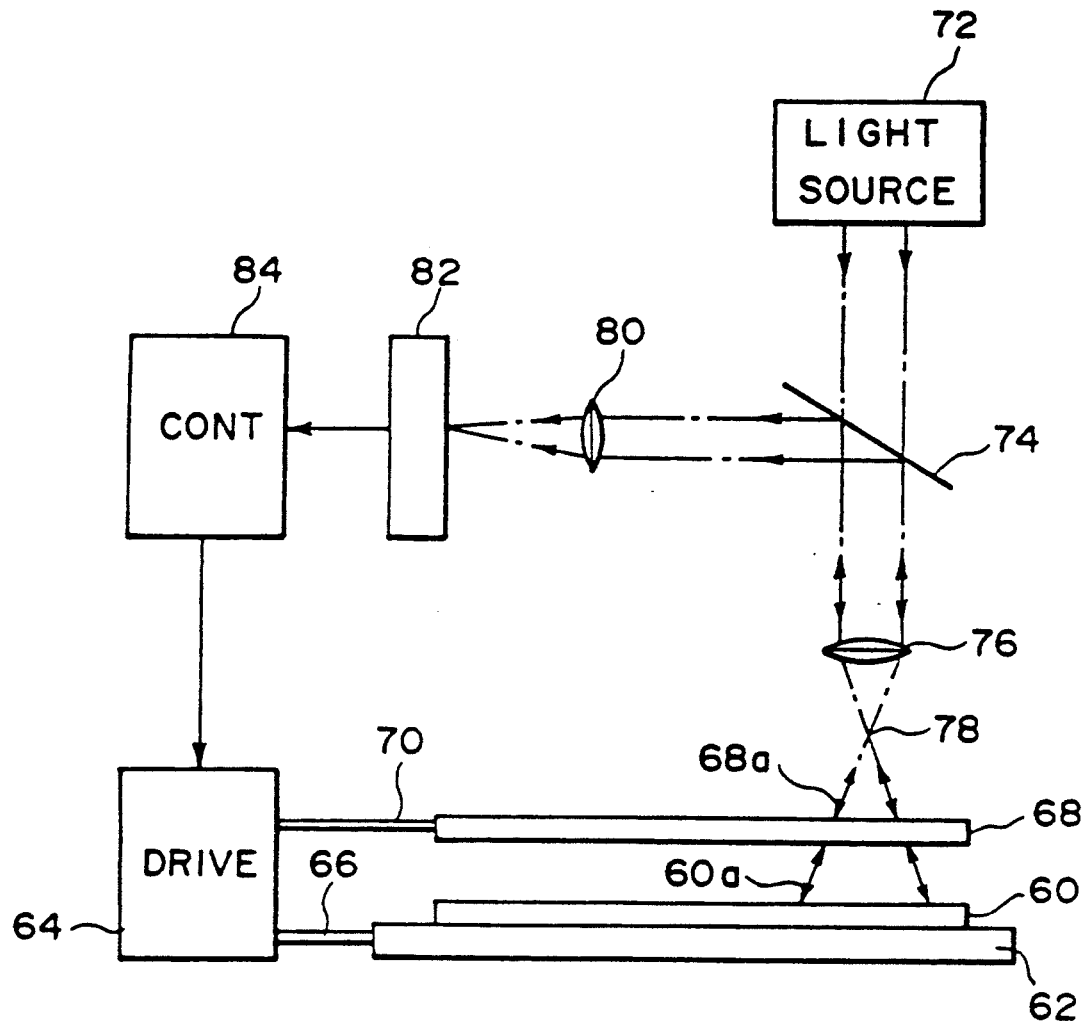
FIGS. 1 and 2 illustrate a known type position detecting device.
Figure 2:
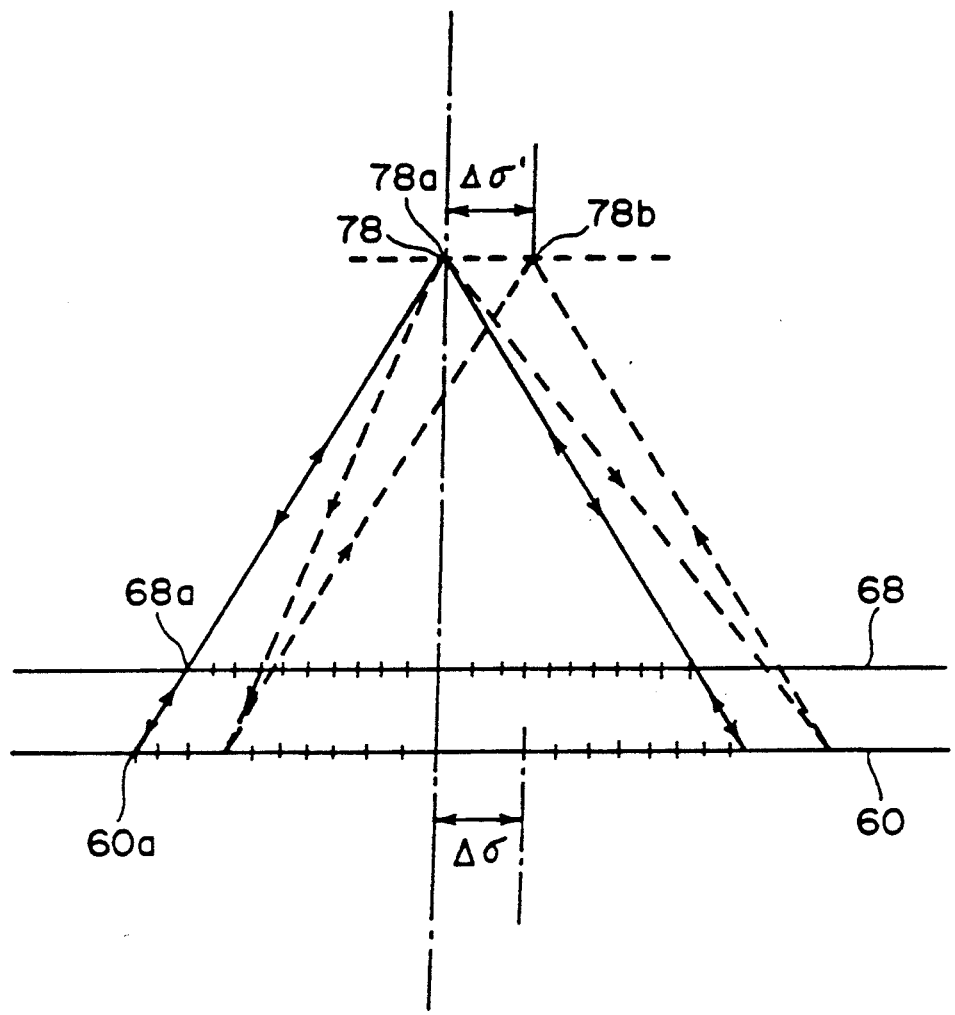
Figure 3A:
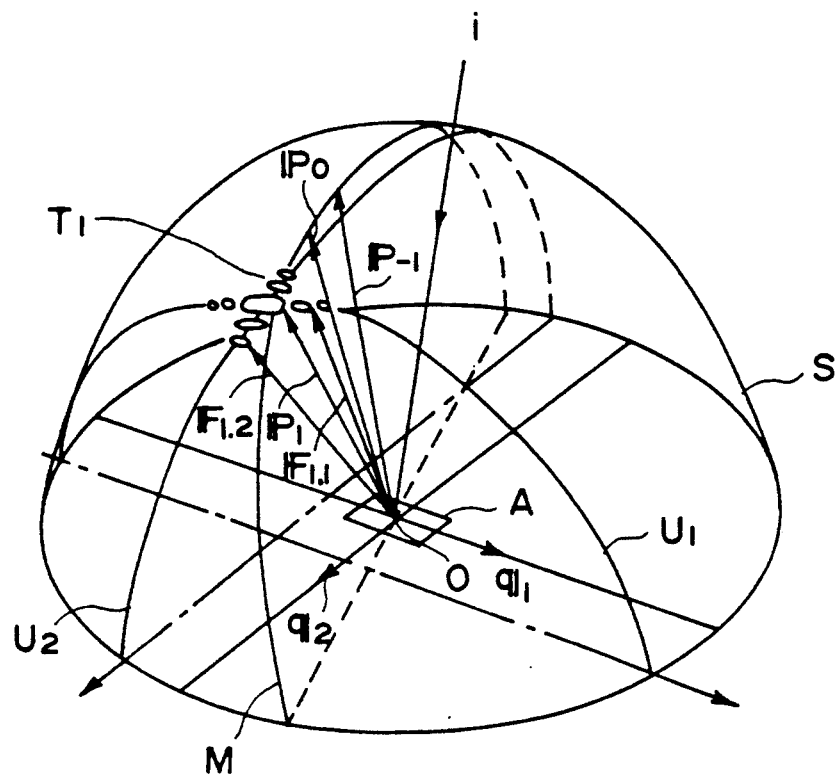
FIGS. 3A, 3B and 4 are schematic representations for explicating Fraunhofer diffraction vectors.

In FIG. 3A, A denotes an aperture (for example, a rectangular aperture); 0 denotes an origin; i denotes light incident upon the diffraction grating; M denotes a plane in which a chief ray vector of reflectively diffracted light, which may be represented as the orientation of the center of Fraunhofer main lobe that is the center of diffraction lights of different orders, lie; $p_0$ denotes a chief ray vector of a zero-th order diffraction light (reflected light); $p_1$ is a chief ray vector of a first order diffraction light; $p_{-1}$ denotes a chief ray vector of a negative first order diffraction light. For convenience, only the diffraction lights of the positive and negative first orders are illustrated. $T_1$ denotes such a region where those of distributed patterns of a first order Fraunhofer diffraction image in which intensity concentration occurs are formed. For convenience, only the first order Fraunhofer diffraction image is illustrated. Definition of $q_1$ and $q_2$ will be made later.

Figure 3B:
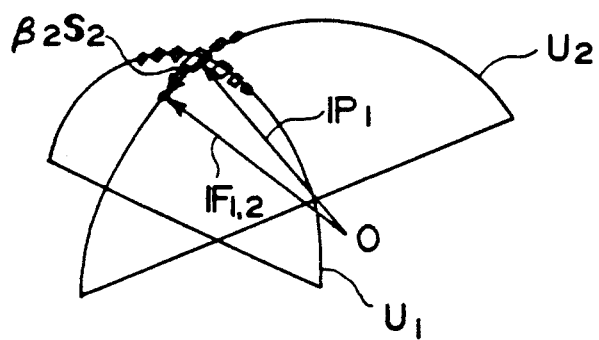
Figure 4:
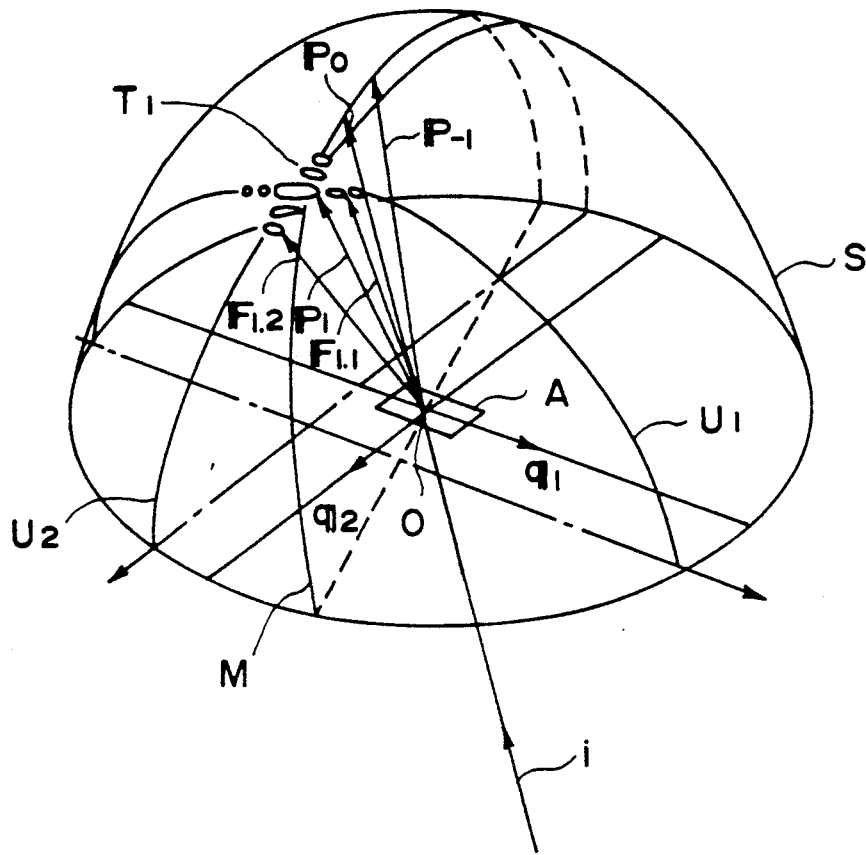

FIG. 4 is similar to FIG. 3 but it represents a transmissively diffracted light distribution whose parameters are defined similarly.

Generally, it is expected that the intensity distribution of Fraunhofer diffraction light, which is produced by projecting light upon a diffraction grating formed at an aperture having a finite number of vertexes, is such distribution in which intensity concentration appears in a particular direction or directions (i.e. a distribution having an expansion of side lobe having a center at a so-called Fraunhofer main lobe. In this Specification, such a straight line which passes the center of a Fraunhofer main lobe of a diffraction image and which has a vector in such particular direction, is referred to as a "center line" of the Fraunhofer diffraction image.

For a particular aperture shape, a particular center line or lines of its Fraunhofer diffraction image are determined. Upon the observation spherical surface, the center line is the line of intersection between that spherical surface and a particular plane (which will be described later) as determined unchangeably by the aperture shape. The peak of intensity distribution of the Fraunhofer diffraction light lies on this curved line. Considering a first order reflective Fraunhofer diffraction light and where the aperture is defined by straight sides $a_1, a_2, \ldots$ and $a_m$ ($m < \infty$) of a number m, for a side $a_i$ ($i = 1, 2, \ldots, m$) one center line $l_i$ is defined. If such a center line $l_1$ is projected upon a plane of the mark in which the aperture is defined (a tangential plane contacting at the original when the aperture is set in a curved surface), the projected is a straight line which is parallel to a normal to the side ai as defined within the mark plane. If, however, two sides in each of n sets of the straight sides of the number m are parallel, there are center lines of a number m-n.

As regards a distribution of Fraunhofer diffraction light of a predetermined order or orders produced by a diffraction grating having a rectangular aperture shape as shown in FIG. 5, there are defined two center lines because, of four normals to the four sides, two normals of each of two sets are parallel to each other. The directions of projection components upon the mark plane of these center lines correspond to the directions of respective normals.

For each diffraction order of the light diffracted by a diffraction grating, there is produced a particular Fraunhofer diffraction pattern. The number and directions of center lines of a Fraunhofer diffraction pattern of each diffraction order are determined not by the diffraction order but by the aperture shape only. However, the position of the center of the Fraunhofer diffraction pattern of each diffraction order is given by the point of intersection, with the observation spherical surface, of a chief ray of the light of a corresponding diffraction order which light is produced as a result of transmissive or reflective diffraction of a chief ray of an incident light.

Thus, an i-th order Fraunhofer diffraction vector $F_{i,j}$ ($j = 1, 2, \ldots, m$) provided grating of such aperture shape as having straight sides of a number m, is given by:

$$F_{i,j} = p_i \beta_j s_j \quad |F_{i,j}| = r \cdot |p_i| = r$$

where $\beta_j$ is a real number and r is a radius of the observation spherical surface and it lies on a plane defined by $p$ and $s_j$ (as an example, the relationship between $F_{1,2}$, $s_2$ and $p_1$ is illustrated in FIG. 3B), wherein $p_i$ denotes a chief ray vector of first order diffraction light and $s_j$ denotes a unit vector which is parallel to the vector $q_j$ of normal (in the mark plane) defined to the j-th straight side of the aperture by the mark plane projection component and which is given by: $s_j = \beta_{j,1} \cdot q_j + \beta_{j,2} \cdot \mathbf{z}$  $\mathbf{z}$ is unit vector of normal to mark plane).

The direction of the vector $p_i$ differs, depending on whether the diffraction is reflective diffraction or transmissive diffraction. In FIG. 3A, the plane $U_1$ in which the vector $F_{1,1}$ lies contains vectors $p_1$ and $s_1$, while the plane $U_2$ in which the vector $F_{1,2}$ lies contains the vectors $p_1$ and $s_2$. The lines of intersection of these planes $U_2$ and $U_2$ with the mark plane are parallel to the vectors $q_1$ and $q_2$, respectively.

Similarly, for such an aperture as having straight sides of a number m in which the sides of each of n sets are parallel to each other, the i-th order Fraunhofer diffraction vectors lie in planes of a number m-n, such that planes $U_1, U_2, \ldots$ and $U_{m-n}$ are defined. The lines of intersections of respective planes with the mark plane are parallel to the vectors $q_1, q_2, \ldots$ and $q_{m-n}$, respectively.

On the other hand, it is expected that, where a diffraction grating is formed in such an aperture as having curved sides and a finite number of vertexes and when light is projected upon this diffraction grating, the intensity distribution of a produced Fraunhofer diffraction light has intensity concentration in a particular direction or directions. If, for example, the aperture has a shape as defined by two arcuations, a produced Fraunhofer diffraction image will be such as illustrated in FIG. 6 (as discussed in "Wave Optics", page 268, Hiroshi Kubota, published by Iwanami Shoten, Japan). In that case, the aperture is shaped by two curved sides and the produced Fraunhofer diffraction image includes intensity concentration in two directions.

For an arbitrary aperture having a finite number of vertexes, the direction of such intensity concentration can be detected from a pattern which is obtainable by Fourier conversion of the aperture shape. Therefore, if the directions in which the intensity concentration occurs can be determined in preparation by calculation of a Fourier conversion image of the aperture, selection may be made to them in accordance with the priority of higher degree of intensity concentration, to determine vectors corresponding to $j$ in the aforementioned equation, and the Fraunhofer diffraction vectors may be determined in accordance with these equations.

Some embodied forms of the present invention will now be explained.

Figure 7:
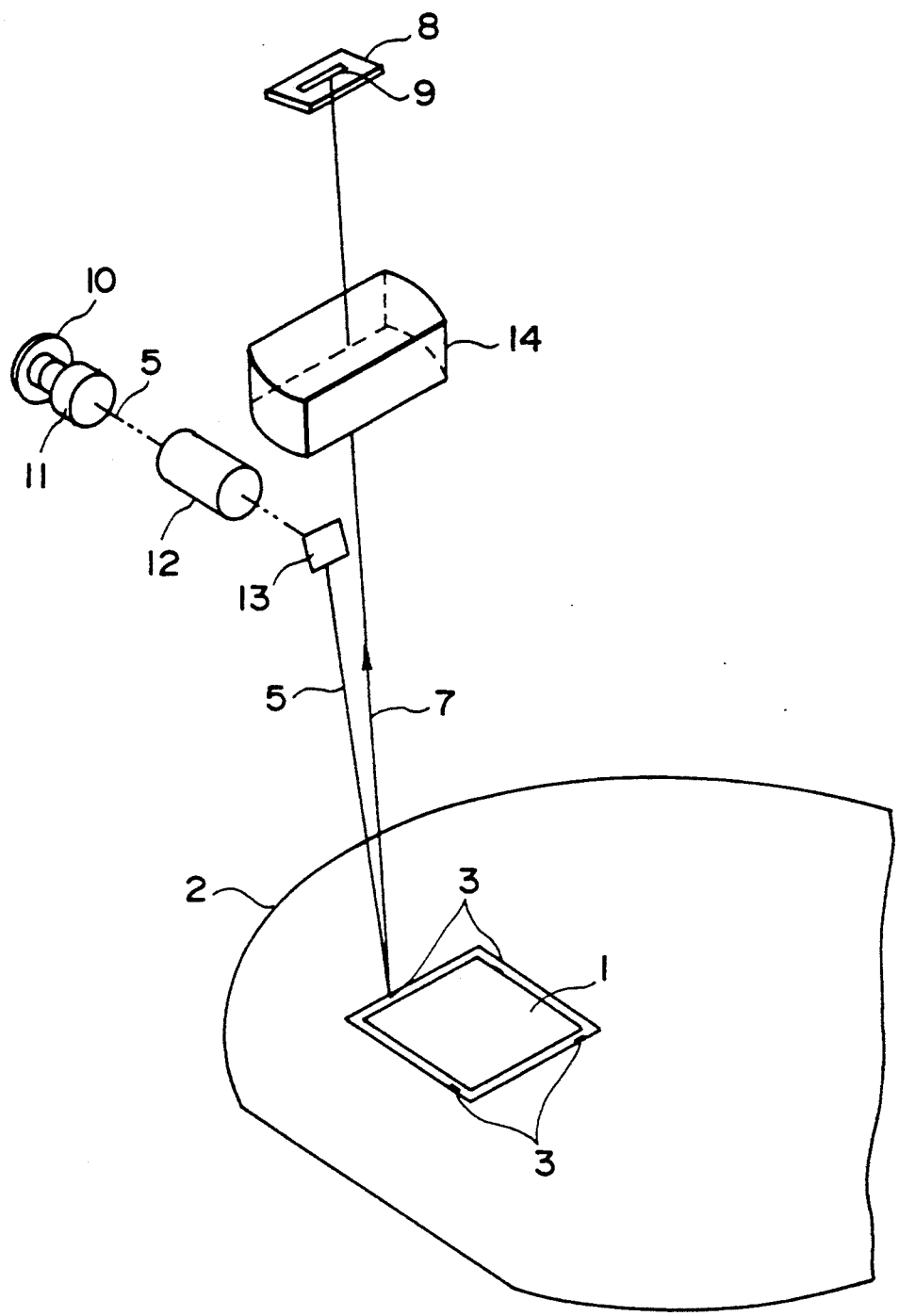
FIG. 7 is a schematic view showing a major portion of a first embodiment of the present invention.

FIG. 7 is a schematic view of a first embodiment of the present invention, wherein the invention is applied to an alignment system in a semiconductor device manufacturing exposure apparatus. FIG. 8 is an enlarged view of a portion of the FIG. 7 embodiment.

In this embodiment, light emanating from a light source 10 passes through a collimator lens 11 and then is projected by a light projecting lens system 12 so that, after being reflected by a reflecting mirror 13, the light is projected at an incline upon a first physical optic element 3 (grating lens or an element effective to convert the wave surface of light) having an oblong peripheral configuration which is provided in a portion of a first object 1 (in this embodiment, a mask having a pattern to be transferred onto a wafer). The first physical optic element 3 may comprise an amplitude type or phase type zone plate, for example.

The first physical optic element 3 has a light collecting function so that the light emanating therefrom is focused at a point of a predetermined distance from the first physical optic element 3. The light divergently advancing from that point is projected upon a second physical optic element 4 (grating lens) which is provided in a portion of a second object 2 (in this example, a wafer onto which a pattern is to be transferred) disposed at a predetermined distance from the focus point. The second physical optic element 4 may comprise a phase type or amplitude type zone plate, for example. Like the first physical optic element 3, the second physical optic element 4 has a light collecting function. The light emanating from the second physical optic element 4 passes through the first physical optic element 3 and, then, it is converged by a condensing lens 14 upon a detection surface 9 of a detector 8. Thus, the optical arrangement of this embodiment provides what can be called a "convex-convex system" including two elements each having a convex lens function.

Namely, in this embodiment, a point of convergence (diffraction image) is formed by the first physical optic element and the light emanating from such a first diffraction image is converged by the second physical optic element, such that the diffraction image is re-imaged.

Figure 8A:
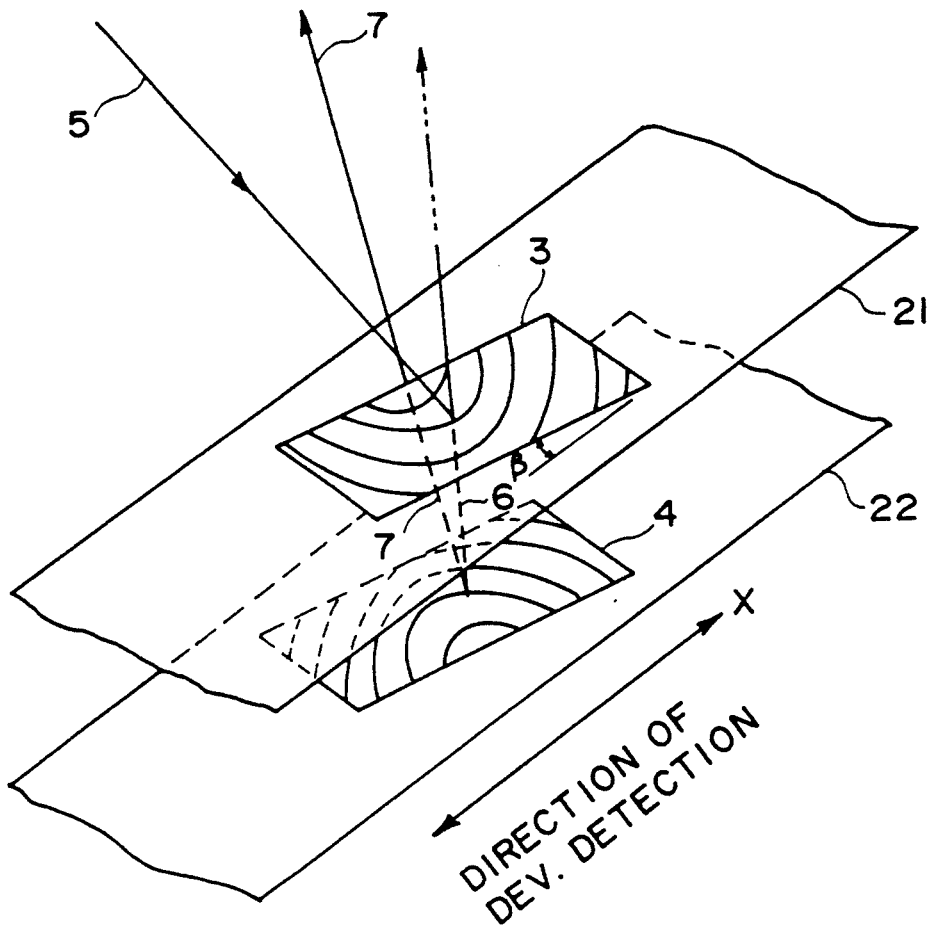
FIG. 8A is a schematic view showing optical paths defined in the neighborhood of a first and second objects, when the first embodiment is used.

Referring to FIG. 8A, the first and second objects 1 and 2 with respect to which any relative positional deviation therebetween is to be evaluated, are provided with first and second physical optic elements 3 and 4 each having an oblong peripheral configuration. Each of the first and second physical optic elements 3 and 4 are provided inclinedly with an angle $\beta$ with respect to a corresponding scribe line 21 or 22. Light 5 is projected upon the first physical optic element 3 and is diffracted thereby. The diffraction light 6 emanating from the first physical optic element 3 is projected upon the second physical optic element 4 and is diffracted again by it. The diffraction light 7 emanating from the second physical optic element 4 passes through the first physical optic element 3 and, then, it is converged upon the detection surface 9 of a detector 8 which may comprise a CCD sensor, a position sensor or otherwise.

If, at this time, there is a relative positional deviation $\Delta\sigma$ between the first and second objects, there occurs a shift $\Delta\delta$ of the center of gravity of light incident upon the detection surface 9, of an amount corresponding to the positional deviation $\Delta\sigma$.

More specifically, if the mask and the wafer displaces relatively to each other, there occurs misalignment between axes of the first and second physical optic elements 3 and 4. In that occasion, the position of incidence upon the physical optic element 4 of the chief ray of the light emanating from the grating lens 3 changes with the relative displacement of the mask and the wafer, such that the angle of emission of the light from the element 4 changes accordingly. As a result, the position of convergence of the light upon the detection surface (sensor) shifts by a certain amount which is proportional to the amount of relative displacement of the mask and the wafer.

If a mask 1 and a wafer 2 is deviated from each other by $\Delta\sigma$ in a horizontal direction and where the distance to the wafer 2 from the point of convergence of the light diffracted by a physical optic element 3 of the mask 2 is denoted by a and the distance from the wafer 2 to the point of convergence of the light diffracted by the physical optic element 4 of the wafer 2 is denoted by b, then the amount of shift ($\Delta\delta$) of the center of gravity of the light on the detection surface 9 is given by:

$$\Delta\delta = \Delta\sigma \times (b/a + 1) \qquad (a)$$

Namely, the shift $\Delta\delta$ has been enlarged by a magnification $\beta = (b/a + 1)$.

Thus, by detecting $\Delta\delta$, it is possible to detect the relative deviation of the mask and the wafer in accordance with equation (a).

In this example, the position on the detecting surface 9 of the center of gravity of light as assumed when the mask and wafer have no positional error may be used as a reference, and the deviation $\Delta\delta$ of the light upon the detecting surface 9 is detected to thereby determine the relative positional deviation $\Delta\sigma$ of the mask and wafer 1 and 2.

The reference position described above can be predetermined. For example, where the first and second objects are a mask and a wafer to be used with a proximity type exposure apparatus 3 and 4, respectively, first the mask having the first physical optic element 3 is held fixed at a suitable position. Then, the wafer having the second physical optic element 4 is placed and roughly aligned with respect to the mask by using suitable means. Thereafter, light is projected upon the first and second physical optic elements, and the position of the center of gravity of light upon the detecting surface 9 in that state is detected. Subsequently, while retaining that state, a pattern of the mask is transferred onto the wafer with suitable radiation energy. The thus transferred pattern is observed by use of a microscope or otherwise, and any pattern overlay error is measured. On the basis of the measured error, the wafer is moved so that it is accurately aligned with the mask. Light is again projected upon the first and second physical optic elements of the thus aligned mask and wafer, and the position of the center of gravity of the light upon the detecting surface 9, as defined at that time, is determined as the reference position.

In this embodiment, such a shift $\Delta\delta$ of the center of gravity of the light 7 incident upon the detection surface 9 is detected to thereby detect the relative positional deviation $\Delta\sigma$ between the first and second objects 1 and 2.

The term "center of gravity of light" means such a point that, when in the cross-section of the light a position vector of each point in the section is multiplied by a value determined as a function of the light intensity of that point and the thus obtained products are integrated over the entire section, the integrated value has a "zero vector".

Figure 8B:
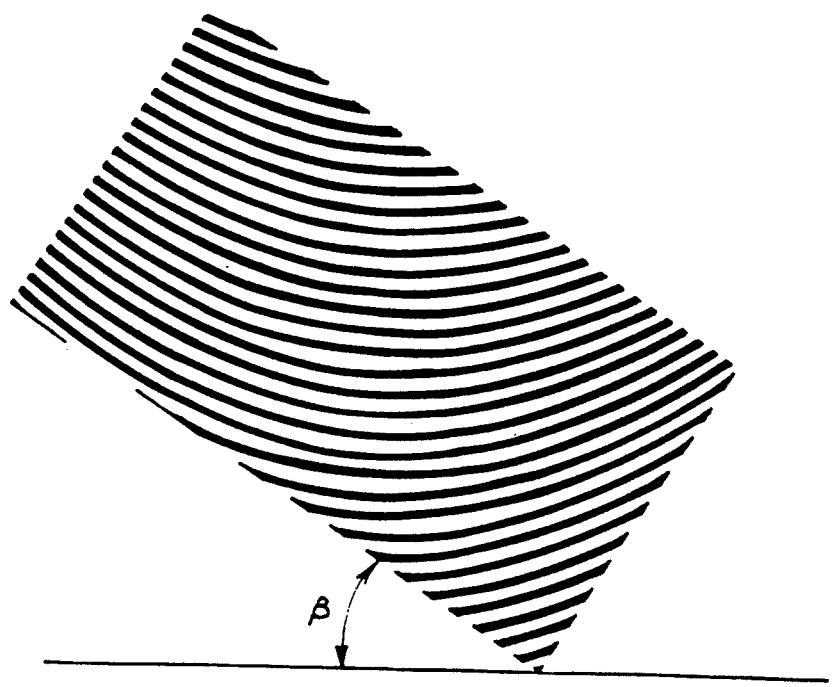
FIG. 8B shows a pattern of a mark which is an example of a first physical optic element usable in the present invention.

FIG. 8B shows an example of a grating lens usable as the first physical optic element 3.

In the embodiment described above, the alignment of two objects is made by detecting the center of gravity. However, the invention is not limited thereto but is effective also to any other type of alignment using diffraction light.

Figure 9:
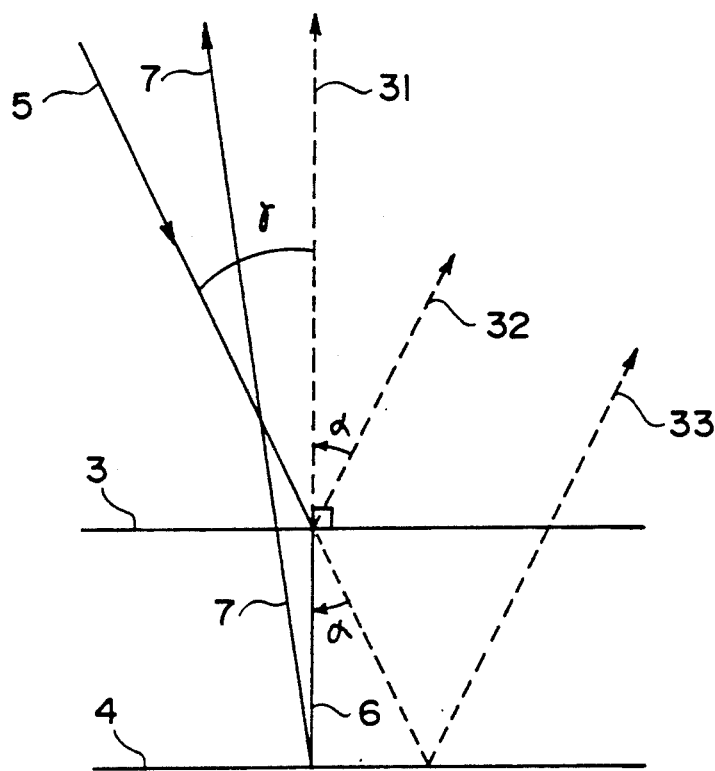
FIG. 9 is an explanatory view, showing the optical action of alignment patterns used in the first embodiment, the action being illustrated as such as viewed in the direction in which the position detection is made.

FIG. 9 is an explanatory view for explicating light other than the signal light, as formed in the structure of FIG. 8A, and shows the grating element 3 and a portion around it as viewed in the direction with respect to which the positional deviation is to be detected. Denoted in FIG. 9 at 5 is a projected light and at 7 is an emanating diffraction light.

Axis 31 denotes the direction of a reflected first order diffraction light caused by the grating lens element 3. Reference numerals 32 and 33 denote the directions of what can be called "zero-th order diffraction lights" provided by the projected light 5 but not having been influenced by the diffraction effect of any one of the grating lens elements 3 and 4. Where the grating lens elements 3 and 4 have no positional deviation, all the lights 5, 7, 31, 32 and 33 are contained in the same plane which plane is orthogonal to the direction X with respect to which any positional error is to be detected. It is easily understood that if a particular positional error (not equal to zero) exists, namely, when the second object 4 is deviated, the angle of the light 7 to be received changes but the other lights do not show any change.

The effect of lights 32 and 33 upon the photodetector 8 side can be avoided by providing a large angle $\gamma$ of incidence of the light projecting path to the grating lens 3.

On the other hand, as regards the direction of the light 31, if the direction $\alpha$ of the first order diffraction light transmitted by the grating element 3 is determined with respect to the zero-th order diffraction light, the direction of the light 31 which is a reflected light is determined with the same angle $\alpha$. As a result, where the lights 5 and 7 in the signal light path are set as shown in FIG. 9, the light 31 which is an unwanted light (main lobe) is necessarily in a direction close to the light 7.

Generally, the light intensity at the center spot of first order diffraction light reflected by a mask changes, depending on the material of the mask, the wavelength of a projected light, the angle of incidence and the state of plane of polarization. Where a pattern is formed by gold or chromium and where a semiconductor laser in the near infrared region is irradiated for about 10-20 degrees, the intensity is of an order of $10^{-1}$–$10^{-2}$ of the incident light quantity.

Where first order diffraction light passing through a mask and first order diffraction light reflected by a wafer as well as light transmitted at the zero-th order through the mask are used, the light intensity of the signal light is of an order of $10^{-3}$–$10^{-5}$ of the light intensity of a projected light. Therefore, it is desirable to set the path of light reception not only to exclude the center light (first order main lobe) of the first order diffraction image formed by reflected at the mask, but also to exclude the side lobe having high intensity of an order of $10^{-1}$–$10^{-2}$ of the center intensity.

Generally, however, there is produced a Fraunhofer image as determined by the outer frame of the grating lens 3, with the light 31 acting as a chief ray. Where the grating lens is defined by an aperture of oblong shape having two sides parallel to the direction in which any positional error is to be detected, a produced corresponding pattern of diffraction light includes an intensity peak within the plane of FIG. 9. As a result, if the structure is such that the grating lenses 3 and 4 have an axis of symmetry in a plane perpendicular to the error detecting direction and if each grating lens has a lens function and has a peripheral configuration of oblong shape and where the positional error is to be detected in respect to a direction along a side of the oblong shape, a portion of side lobe light of an intensity of an order of $10^{-2}$–$10^{-3}$ of the center intensity overlaps upon the path for light reception. Such a superposed component acts as a noise to the signal light and leads to a factor for reduction in precision.

In this embodiment, in consideration of this, the center of the photodetector 8 is set to satisfy that it is included in such plane which include the path of the light 5 to be incident upon the grating element 3 (FIG. 8A) and which is orthogonal to the surface of the element 3 and that the center of the detector is disposed in a space defined between planes each extending on through the center of the grating element 3 and extending a side of the aperture shape of the element 3. The optical arrangement is set so that along the effective light receiving zone of the detector 8 the received light is displaceable. With this structure, the described problems can be solved.

Namely, such a structure is used in which the main lobe and its side lobe caused by the grating lens (hereinafter these two lobes will be referred to as "unwanted diffraction light") are not directed to the photodetector 8.

Figure 10:
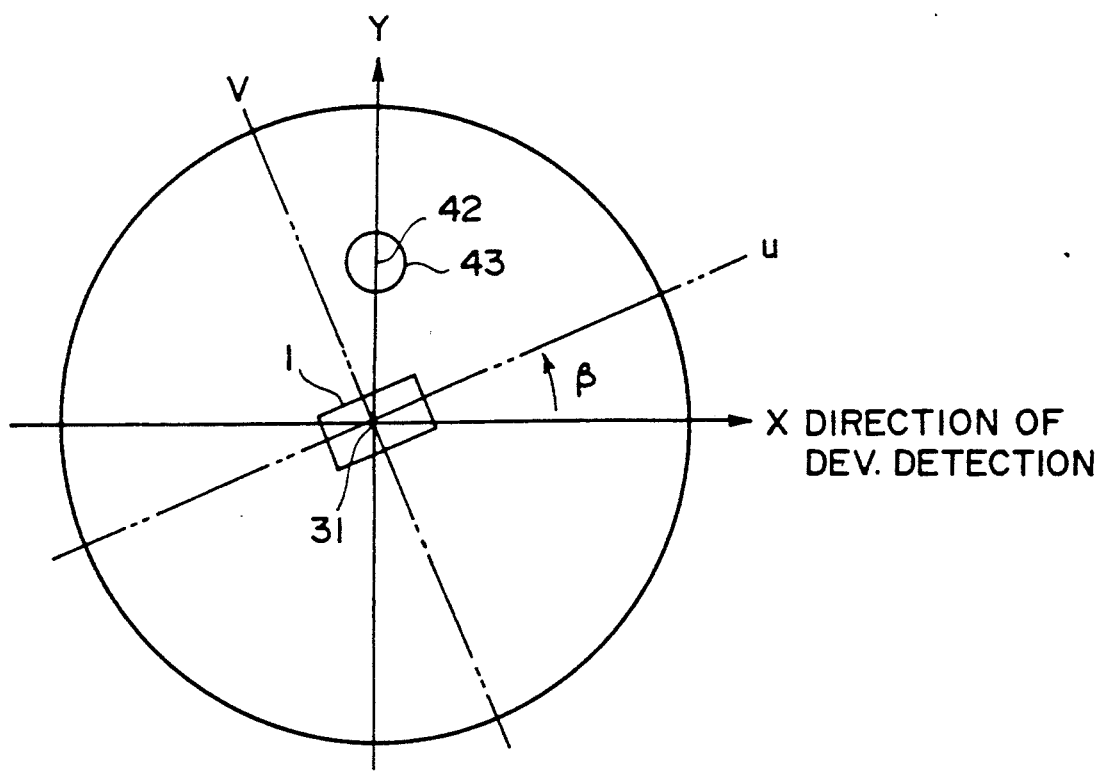
FIG. 10 is a schematic view showing the relationship between a Fraunhofer diffraction image and an entrance pupil of a light receiving system, as viewed from the above of a mask portion used in the first embodiment.

The features of the present embodiment will be explained in more detail, taken in conjunction with FIGS. 8A and 8B as well as FIG. 10 showing the state of lights as the mask is observed from an arbitrary plane above and parallel to the mask 1 surface. In this case, diffraction light 31 advances in the direction of a normal to the first object, i.e., it advances just upwardly.

In this embodiment, each of the grating lens elements 3 and 4 provided on the mask and the wafer has an oblong peripheral shape. The error detecting direction, i.e., the direction in which any positional error is to be detected is in the X-axis direction. Each of the grating lenses 3 and 4 has a cylindrical power in the X direction. Each side of the oblong configuration has an angle of inclination $\beta$ to the direction which is perpendicular to or parallel to the X axis, to allow exclusion of Fraunhofer diffraction image, as will be descried later.

At this time, as a main change in the action of light, in the structure of FIG. 8, the well-known Fraunhofer diffraction image rotates by $\beta$ while taking an axis 31 (FIG. 10) as a rotational axis.

More specifically, of the Fraunhofer diffraction image caused by a grating lens on a mask 1, those portions emanating in a direction close to the light to be received are aligned with the axes u and v. This provides a coordinate system which is rotated by $\beta$ to the direction X of deviation detection. As a result, the axis v having been superposed upon the Y axis rotationally shifts by $\beta$, relative to an entrance pupil 43 which is the projection component upon this section of the photodetector 8 which is in the neighborhood of the center 42 of the light to be received. This is effective to prevent the Fraunhofer diffraction image from entering into the entrance pupil 43. Namely, the direction of a straight line portion of a mark is inclined relative to the photodetecting portion to thereby shift a plane in which the Fraunhofer diffraction vectors are contained.

As an alternative, use of a slightly deformed parallelogram will attain substantially the same results.

Figure 11:
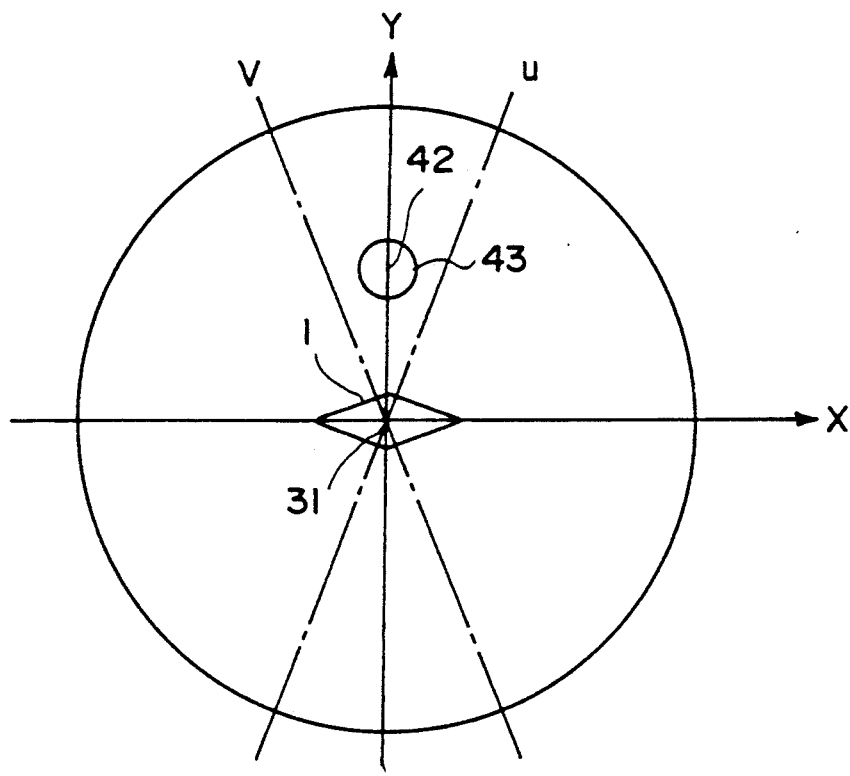
FIG. 11 is a schematic view showing a Fraunhofer diffraction image, produced in a second embodiment of the present invention.
Figure 12:
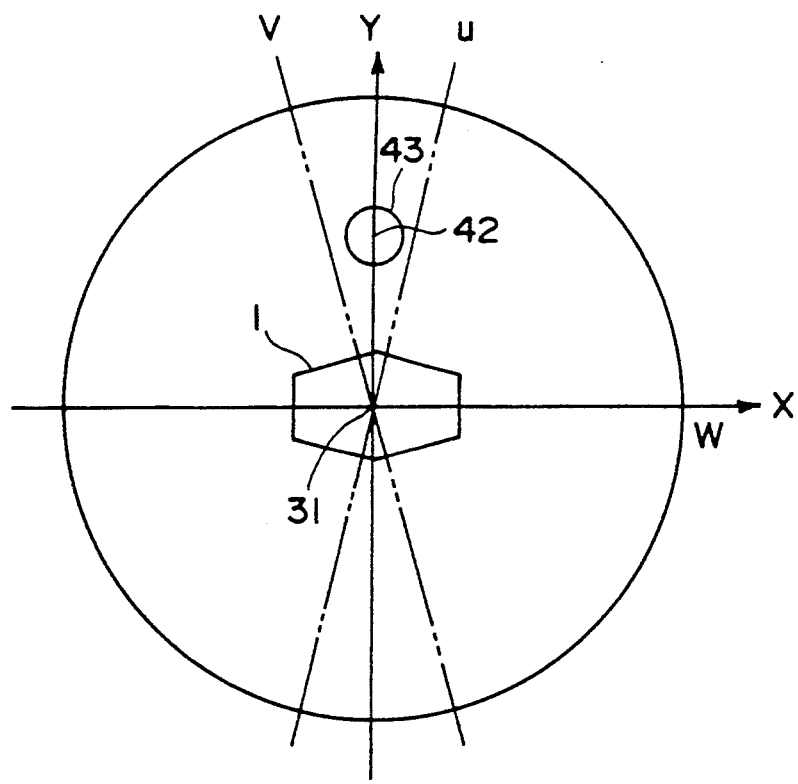
FIG. 12 is a schematic view showing a Fraunhofer diffraction image produced in a third embodiment of the present invention.

FIGS. 11 and 12 show second and third embodiments of the present invention, each representing a Fraunhofer diffraction image as viewed from the above. In the second embodiment shown in FIG. 11, a grating lens element provided in a portion of a mask has a lozenge shape, wherein one of two lines each connecting two opposed vertexes is selected as the direction of deviation detection, while the other is selected as the direction in which the path of light reception is set.

Generally, in the direction connecting two vertexes, a formed Fraunhofer diffraction image does not have a portion of high intensity. As a result, in this example, the effect of unwanted light upon the entrance pupil 43 can be made small.

Figure 13:
FIG. 13 shows a pattern of a mark which is an example of a grating element provided in a portion of a mask, usable in the third embodiment of the present invention.

In the third embodiment shown in FIG. 12, a grating element provided in a portion of a mask has a hexagonal shape. FIG. 13 shows an example of a pattern usable as such a grating element. Of a Fraunhofer diffraction image produced at this time, those portions as having higher intensity are produced in three directions of axes u, v and w. However, also in this occasion, by setting the path of light reception in the Y-axis direction as illustrated in which opposed vertexes are connected, it is possible to exclude the effect of unwanted light.

It will be understood that, with an outer configuration provided by coupling two or more lozenge shapes or hexagonal shapes in the X-axis direction, for example, similar advantageous results are obtainable. While, in the foregoing, the peripheral shape of a grating lens has been described as those having vertexes, similar advantageous effects are attainable with an outer configuration defined by a curved line or lines.

In some embodiments described below, a photodetecting portion is displaced out of a plane in which Fraunhofer diffraction vectors are contained.

Figure 14:
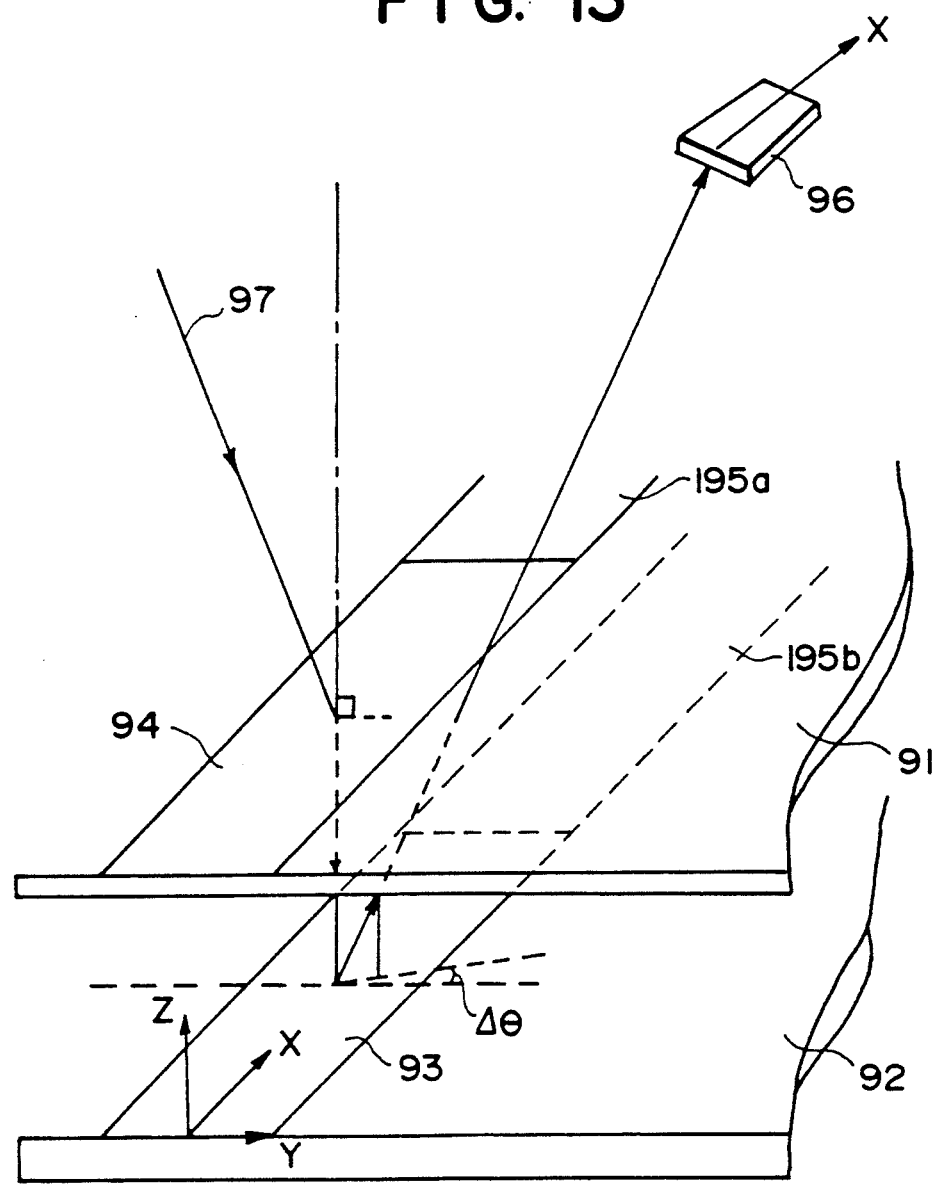
FIG. 14 is a schematic view showing a major portion of a fourth embodiment of the present invention.

FIG. 14 is a schematic view showing a major portion of a fourth embodiment of the present invention. Denoted in FIG. 14 at 91 is a first object which is a mask, for example. Denoted at 92 is a second object which is a wafer, for example, that is to be aligned with the mask 91. Denoted at 94 and 93 are first and second alignment marks, respectively, which are provided in portions of the mask 91 surface and the wafer 92 surface, respectively. Each of the first and second alignment marks 94 and 93 may comprise a grating lens such as a Fresnel zone plate, for example. These alignment marks are provided on scribe lines 195a and 195b formed on the mask 91 surface and the wafer 92 surface, respectively. Denoted at 97 is an alignment light having been emitted from a light source (not shown) included in an alignment head (also not shown) and having been collimated into a predetermined beam diameter.

In this embodiment, examples that can be used as a light source are: a light source such as a semiconductor laser, a He-Ne laser, an Ar laser or otherwise that can emit a coherent light; and a light source such as a light emitting diode or otherwise that can emit an incoherent light. Sensor (photoreceptor) 96 functions as a first detecting means and is adapted to receive the alignment light 97. The sensor may comprise a one-dimensional CCD sensor, for example.

In this embodiment, the alignment light 97 is incident upon the first alignment mark 94 at a predetermined angle. The incident light is transmissively diffracted and then is reflectively diffracted by the second alignment mark 93 on the wafer 92 surface. The reflectively diffracted light is finally incident upon the sensor 96 surface. The sensor 96 is operable to detect the position of the center of gravity of the alignment light projected on its surface. By using output signals of the sensor 96, the relative position of the mask 1 and the wafer 2 in a direction parallel to scribe lines 95a and 95b (i.e. in the x direction) is determined.

Description will now be made of the first and second alignment marks 94 and 93 used in this embodiment.

The alignment marks 93 and 94 are provided by Fresnel zone plates (or grating lenses) having different focal lengths. Each mark has a size of 280 microns in the lengthwise direction of the scribe line and 70 microns in the widthwise direction (y direction) of the scribe line.

In this embodiment, the alignment light 97 is incident on the mask 91 at an angle of incidence of 10 degrees, with the projection component upon the mask 91 surface being perpendicular to the scribe line direction (x direction). The alignment light 97 incident on the mask 91 with a predetermined angle is influenced by the lens function of the grating lens 94 so that it is transformed into a convergent or divergent light which is emitted from the mask 91 so that its chief ray has a predetermined angle with respect to the normal of the mask 91.

The alignment light 97 having been transmissively diffracted by the first alignment mark 94 is focused at a point on the wafer 92 surface which is at a distance of 238.0 microns vertically below the wafer surface 92. The alignment mark 94, in this case, has a focal length of 268 microns. Also, the mask 91 and the wafer 92 are spaced by a distance 30 microns.

The light transmissively diffracted by the alignment mark 94 is influenced by a concave or convex lens function of the second alignment mark 93 on the wafer 92 surface, and is collected on the sensor 96 surface (first detecting means). On this sensor 96 surface, at this time, the light is incident with any relative positional deviation (i.e. any misalignment of the axes) of the marks 94 and 93 being magnified, with a result of corresponding shift of the position of the center of gravity of the incident light.

The present embodiment is so set that, when the mask 91 and the wafer 92 have no relative positional deviation (i.e. when the alignment marks 94 and 93 on the mask 91 and the wafer 92 just provide a coaxial system), the chief ray of the alignment light emitting from the wafer 92 has an angle of emission of 5 degrees, the projection component of the emitted light on the wafer 92 surface extending in a direction of 4 deg. with respect to the widthwise direction (y direction) of the scribe line to thereby exclude or evade Fraunhofer diffraction image from the mask and wafer. Additionally, the emitted light is focused on the sensor 96 surface whose center coordinate is disposed at a site (0.98, 4.2 and 18.7) (unit: mm) with respect to the center coordinate of the mask 91 surface. Namely, the photodetecting portion for receiving the emitted light is disposed out of a plane in which Fraunhofer diffraction vectors are contained.

Further, the direction of array of the sensing elements of the sensor 96 in its effective light receiving region is set in the x direction, and the effective light receiving region has a length of 4.8 mm in the x direction. The position of incidence of the alignment light upon this effective light receiving region displaces with the positional deviation between the mask and the wafer.

Figure 15:
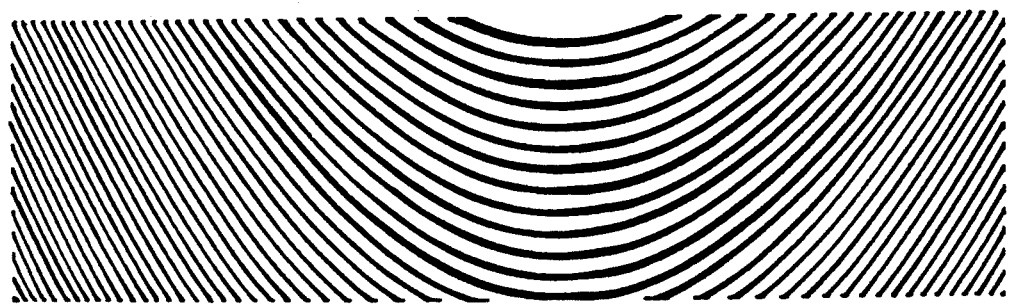
FIG. 15 shows a pattern of a mark which is an example of a grating element provided in a portion of a mask, usable in the fourth embodiment of the present invention.

An example of a pattern usable in the present embodiment as a grating lens is illustrated in FIG. 15. The pattern exemplified in FIG. 15 has the same lens function both in the x direction and the y direction. Also it has a function for deflecting the advancing direction of the light, in the y direction and at a predetermined angle.

As an example, first and second alignment marks 94 and 93 (grating lens) usable in this embodiment can be prepared in the following manner:

First, the marks 94 for a mask are designed so that, when a parallel light of a predetermined beam diameter is incident thereupon at a predetermined angle, the light is collected at a predetermined position. Usually, a pattern of a grating lens may be that of an interference fringe which can be formed on a lens surface in an occasion where mutually coherent light sources are disposed at a light source position (object point) and the position of an image point. Assumingly, a coordinate system is defined on a mask 91 surface, such as shown in FIG. 14. The origin is at the middle of the width of the scribe line, the x axis is in the direction of the scribe line, the y axis is in the widthwise direction and the z axis is in the direction of the normal of the mask 91 surface. Equations regarding a group of curved lines of such a grating lens by which a parallel light, having been incident thereon with an angle $\alpha$ with respect to the normal of the mask surface 91 and with the projection component being perpendicular to the scribe line direction, is imaged after being transmissively diffracted by the mark of the mask, at the position of a converging point $(x_1, y_1, z_1)$, can be expressed in the following manner, with the position of each grating line being denoted by x and y:

$$y \sin\alpha + P1(x,y) - P2 = m\lambda/2 \quad (1)$$

$$P1(x,y) = \sqrt{(x-x_1)^2 + (y-y_1)^2 + z_1^2}$$

$$P2 = \sqrt{x_1^2 + y_1^2 + z_1^2}$$

wherein $\lambda$ is the wavelength of the alignment light and m is an integral number.

Assuming now that a chief ray is such a ray being incident with an angle $\alpha$ and passing through the origin on the mask surface 91 and then impinging upon a convergent point $(x_1, y_1, z_1)$, then the right side of equation (1) shows that, depending on the value of m, the optical path length is "$\lambda \times m/2$" times longer (shorter) than that for the chief ray; and the left side denotes the difference in length, with respect to the optical path of the chief ray, of the optical path of such a ray that passes a point (x, y, 0) on the mask and then impinges on the point $(x_1, y_1, z_1)$.

According to equation (1), the light passing a point y on the mask 91 surface does not shift at the imaging point in the y direction.

On the other hand, a grating lens to be provided on a wafer 92 is designed so as to collect, at a predetermined position (on the sensor surface), a spherical wave emanating from a predetermined point light source. Where the gap between a mask 91 and a wafer 92 at the time of exposure (pattern transfer) is denoted by g, then such a point light source can be expressed by:

$$(x_1, y_1, z_1 - g)$$

wherein y is a variable.

Assuming now that the mask 91 and the wafer 92 are to be aligned with respect to the x-axis or y-axis direction and that, upon completion of alignment, the alignment light is focused at a point $(x_2, y_2, z_2)$ on the sensor surface, then equations regarding a group of curved lines of a grating lens of a wafer can be expressed, in the coordinate system defined hereinbefore, as follows:

$$\sqrt{(x-x_2)^2 + (y-y_2)^2 + z_2^2} - $$

$$\sqrt{(x-x_1)^2 + (y-y_1)^2 + (z_1-g)^2} = \quad (2)$$

-continued $$\sqrt{x_2^2 + y_2^2 + z_2^2} - \sqrt{x_1^2 + y_1^2 + z_1^2}$$

Equation (2) is such an equation that satisfies a condition under which, assuming that the wafer surface is "$z = -g$" and that the chief ray is such a ray that passes the origin on the mask surface and a point (0, 0, $-g$) on the wafer surface and additionally a point $(x_2, y_2, z_2)$ on the sensor surface, the difference in length between the path of the chief ray and the path of a ray passing the grating (x, y, $-g$) on the wafer surface becomes equal to a multiple, by an integral number, of a half wavelength.

In a particular example, patterns were designed with specifications in accordance with equations (1) and (2) that $x_2 = -980.0$ micron; $y_2 = 4200.0$ micron; $z_2 = 18700.0$ micron; $x_1 = 0.0$ micron; $y_1 = 0.0$ micron; $z_1 = -184.72$ micron; m=1 and $\alpha = 17.5$ degrees.

Generally, a zone plate (grating lens) for a mask can be formed as an amplitude type grating element of "0 and 1" in which two regions, a region (transparent portion) that can transmit light and a region (light blocking portion) which does not transmit light, are formed alternately. On the other hand, a zone plate for a wafer can be formed as a phase grating pattern having a rectangular section, for example. The fact that, in equations (1) and (2), each line of a grating is defined at a position which corresponds to a multiple, by an integral number, of a half wavelength with regard to the chief ray, means that the linewidth ratio of the transparent portion and the light blocking portion is 1:1 in the case of the grating lens on a mask 91, and that the line and space ratio of rectangular grating is 1:1 in the case of the grating lens on the wafer 92.

As a specific example, a grating lens on a mask 91 was formed by transferring, onto an organic thin film of polyimide, a grating lens pattern of a reticle prepared by use of electron beam exposure technique.

On the other hand, a mark on a wafer 92 was formed by preparing on a mask a pattern to be printed on a wafer and then by transferring the pattern by use of a lithographic process.

Description will now be made of the relationship between a signal light (alignment light) to be incident on a sensor (detecting means) which may comprise an accumulation type one-dimensional CCD sensor, for example.

In this embodiment, the signal light (for alignment) emanates from the wafer surface at angle of 5 degrees in the Y-Z plane, with respect to the normal of the wafer surface and with the projection component, upon the wafer surface, being at an angle of 3 degrees in the X-Z plane. The spatial disposition of the sensor 96 is so set that, upon completion of alignment, a light is incident on the sensor substantially at the middle position.

In the present invention, in order to avoid that the Fraunhofer diffraction pattern as determined by the aperture shape of the alignment mark is superposed upon the alignment signal light, on the sensor surface, to deteriorate the signal-to-noise ratio or that the signal light intensity distribution changes as a result of interference to cause shift of the position of the center of effective light quantity, the design of the alignment mark pattern and the disposition of the sensor are determined to assure that, even when the mask and the wafer have no relative positional deviation, the light rays (alignment light) directed from the alignment mark to the sensor is deflected to the outside of the plane in which the alignment light has been first incident.

As regards the size of the sensor 96, it is 1 mm in width and 6 mm in length. Each picture element (pixel) has a size of 25×500 microns.

Each sensor is operable to measure the position of the center of gravity of incident light, and output signals from the sensor is processed so as to be standardized with regard to the total light quantity over the whole light-receiving region. By this, even if the output power of a light source for alignment changes slightly, the measured value as outputted from the sensor system exactly represents the position of the center of gravity. Although the resolution of the sensor, for the position of the center of gravity, may depend on the power of the alignment light, it was 0.2 micron where a semiconductor laser having a power of 50 mW and a wavelength 0.83 micron was used, by way of example.

In a design example for a grating lens of a mask and a grating lens of a wafer, to be used in the present embodiment, the center of gravity of the signal light displaces along the sensor surface, with the positional deviation between the mask and the wafer being magnified by ×100. Therefore, a positional deviation of 0.01 micron between the mask and the wafer results in an effective displacement of the center of gravity on the sensor surface through 1 micron. The sensor system can measure such a displacement with a resolution of 0.2 micron.

Figure 16A:
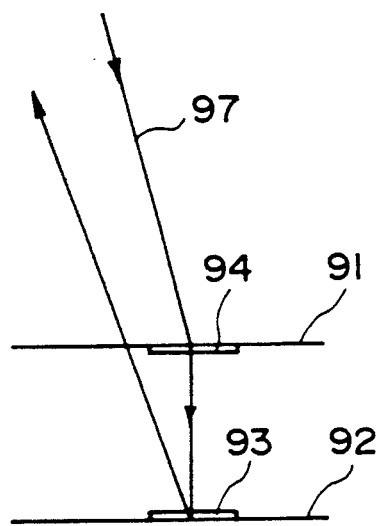
FIGS. 16A and 16B are schematic representations showing a major portion of a fifth embodiment of the present invention.
Figure 16B:
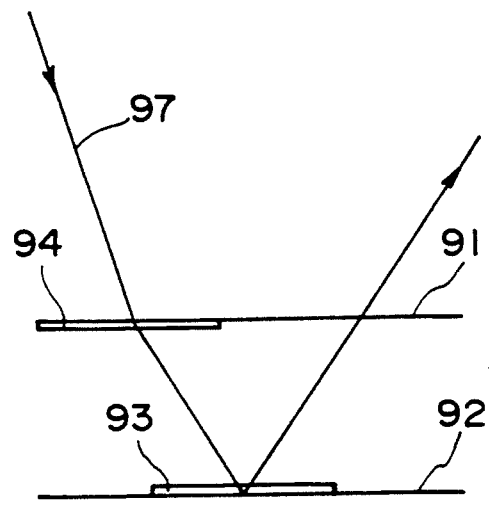

FIGS. 16A and 16B are schematic views showing a major portion of a fifth embodiment of the present invention. More specifically, FIGS. 16A and 16B are sections taken on a y-z plane and an x-z plane, respectively, showing the path of alignment light where an x axis is laid in the direction of a scribe line while a z axis is laid in the direction of a normal to a mask surface.

In this embodiment, an alignment light 97 emanating from a semiconductor laser in an alignment head (not shown) and passed through a light projection system in the head is incident at an incline upon a first alignment mark 94 provided on the mask surface 91.

By this alignment mark (physical optic lens element) 94 on the mask 91 surface, the alignment light 97 is deflected out of the plane along which it has been incident on the mask. In this example, the light is deflected in the x direction as viewed in the drawings. Thereafter, the light path is deflected again by a second alignment mark (physical optic lens element) 93 on a wafer 92 surface by a predetermined angle toward the alignment head.

Namely, in this embodiment, the alignment of the physical optic lens element 94 on the mask 91 surface and the physical optic lens element 93 on the wafer 92 surface is completed with these physical optic lens elements being relatively shifted in the direction of the scribe line. In the y-z plane of FIG. 16A, the angle of incidence of the alignment light upon the mask surface is 8 degrees; the angle of incidence upon the wafer surface of a chief ray of first order diffraction light is 0 degree (namely, perpendicular incidence); and the angle of emission of first order diffraction light from the wafer surface is 17.5 degrees. In the x-z plane of FIG. 16B, the angle of incidence of the alignment light upon the mask surface is 5 degrees; the angle of incidence upon the wafer 92 surface of the chief ray of the first order diffraction light is 7 degrees; the angle of emission of the first order reflective diffraction light from the wafer 91, in the x-z plane, is 7 degrees (the physical optic lens element 93 on the wafer 92 surface has no deflecting function in the y-z plane); and the angle of emission of that first order transmissive diffraction light from the mask 91 surface is also 7 degrees.

In the fifth embodiment, each of the physical optic elements of the mask and the wafer comprises a grating lens element effective to image an object point upon a predetermined position, like those of the first embodiment. The power arrangement of the grating lens system is determined so as to provide a magnification sensitivity of ×100 as in the first embodiment, the alignment light being imaged upon a sensor within the alignment head as the mask-to-wafer gap is set to 30 microns. The specifications of the size of each mark as well as the power arrangement of the grating lens system are the same as in the first embodiment.

In this embodiment, each of the grating lenses 94 and 93 of the mask 91 and the wafer 92 has a deflecting function for deflecting a received light out of the plane along which the light has been incident. This provides the following advantageous results.

First, it is assured that a Fraunhofer diffraction pattern directly reflectively diffracted by the grating lens of the mask back to the alignment head does not impinge upon the sensor within the alignment head. Thus, it is ensured to prevent reception of even a portion of the direct reflective diffraction light from the mask surface by the sensor, which light has the highest intensity of the unwanted diffraction lights coming back to a portion adjacent the sensor. Therefore, it is possible to avoid pickup of such noise light which leads to a factor of error in the detection of the position of center of gravity of the alignment signal light.

Figure 17:
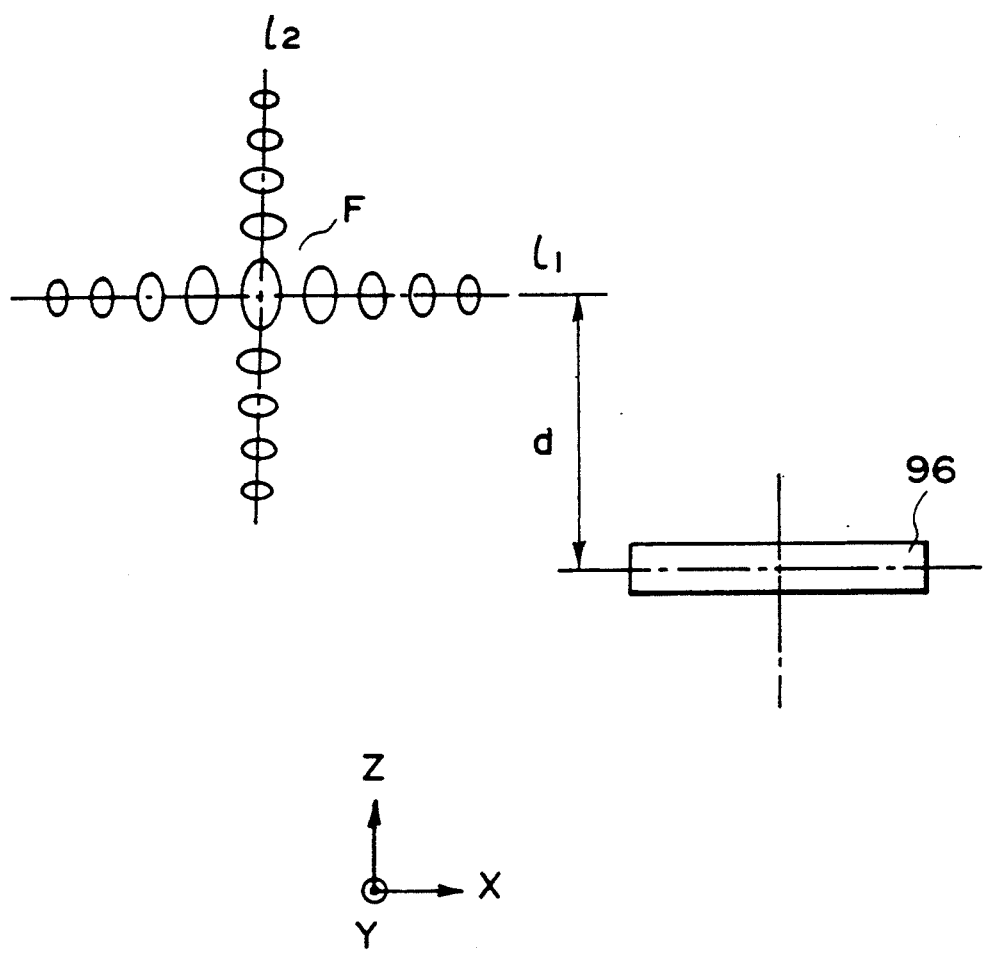
FIG. 17 is an explanatory view for explicating the relationship between a used sensor and a diffraction light, in the fifth embodiment of the present invention.

FIG. 17 is a schematic representation, illustrating the position of the sensor in the alignment head of the fifth embodiment as well as the distribution of direct reflective diffraction light from the mask surface coming back to this alignment head. The direct reflective diffraction light from the mask surface provides a Fraunhofer diffraction pattern F. Since the grating lens on the mask surface has a rectangular aperture shape accommodated in the scribe line, the Fraunhofer diffraction pattern F in the alignment head includes a component having a distribution parallel to the direction in which the displacement of the center of gravity of light upon a one-dimensional sensor 96 corresponding to a positional deviation between the mask and the wafer is to be detected, and another component having distribution parallel to a direction which is perpendicular to the displacement detecting direction.

Since in this embodiment any positional error in the direction of the scribe line is to be detected, in the x-z plane the angle of incidence of the alignment signal light upon the grating lens of the mask differs from the angle of emission of the same from the grating lens of the wafer. Therefore, even if there is formed a diffraction pattern having a component distributed in parallel to the line direction of the one-dimensional sensor, such a diffraction pattern is not received by the sensor 96.

More specifically, in the x-z section of FIG. 17, the position of the center of an unwanted Fraunhofer diffraction pattern F is relatively deviated from the position of center of the sensor 96 by a distance d in the z direction. The distance d is determined by the angle of incidence of the alignment light in the x-z plane, the angle of emission of the same toward the alignment head as well as the position of the sensor in the head.

It is desirable in the present embodiment to use such a grating lens element as having no lens function in a direction perpendicular to the scribe line so as to surely avoid that, when there is a positional deviation in a direction perpendicular to the scribe line, the returning alignment light misses the one-dimensional sensor.

A second effect is that the deflecting function of the grating lens of the mask effective to transmissively emit a received alignment light at an angle in the y-z plane different from the angle of incidence of the received light, easily assures that the light reflectively diffracted from the wafer surface does not pass through the grating lens of the mask but does pass through the mask surface.

In the fourth embodiment described hereinbefore and in the present (fifth) embodiment, the alignment signal light passes the mask twice and is reflected once by the wafer surface. However, it is influenced by the lens function only when it is first transmissively diffracted by the mask surface and when it is reflectively diffracted by the wafer surface.

Namely, on the second-time passage of the light through the mask, only a zero-th diffraction light component is utilized even if the light passes the grating lens portion. In other words, what is detected as the signal light in respect to the detection of the position of center of gravity upon the sensor is such a light having passed through the grating lens of the mask by first order diffractive transmission, having been reflected by the grating lens of the wafer by first order reflective diffraction and having passed through the grating lens of the mask by zero-th order transmission (transmission through the mask surface).

Where the optical path is set so that the light passes the grating lens of the mask by zero-th order transmission, the intensity distribution of the light upon the sensor surface is modulated because the zero-th diffraction efficiency is not uniform over the grating lens but is varying spatially. This is because the pitch of the grating lens is not uniform spatially but is modulated spatially in accordance with equations (1) and (2) as discussed with reference to the first embodiment (generally, the diffraction efficiency changes with the pitch (diffraction angle)).

In order that the alignment light is not influenced by the grating lens function upon the second-time passage thereof through the mask, the mask and wafer grating lens elements are set so as to deflect the alignment light outwardly of a plane of incidence which contains the path of incident light and a normal to the mask surface.

FIGS. 18A and 18B are schematic representations showing a major portion of a sixth embodiment of the present invention. More specifically, FIG. 18A is a y-z section in a coordinate system as depicted in FIG. 14, and FIG. 18B is an x-z section. In these Figures, solid lines depict an alignment signal light, while broken lines depict a reference light.

In this embodiment, an alignment light $97a$ and a reference light $97b$ are incident upon a first alignment mark $93a$ on the mask 91 surface and a first reference mark $93b$ on the mask 91 surface, respectively, each at a predetermined angle. The alignment light and the reference light are transmissively diffracted by these marks and then they are reflectively diffracted by a second alignment mark $94a$ and a second reference mark $94b$, respectively, both of which are provided in a portion of a wafer 92 surface. The reflectively diffracted alignment light and reference light are directed to and received by respective sensors $96a$ and $96b$, which are not shown in these drawings. Each of these sensors $96a$ and $96b$ is serviceable to detect the position of the center of gravity of the received alignment light $97a$ or the received reference light $97b$ and, by using output signals from these sensors, the mask 91 and the wafer 92 can be brought into alignment with respect to the direction of a scribed line (x direction).

In this embodiment, the pattern designing for the alignment mark $93a$ and the reference mark $93b$ is made in accordance with designing equation (1), and the pattern designing for the alignment mark $94a$ is made in accordance with designing equation (2). The reference mark $94b$ comprises a straight-line grating and has no lens function.

In this embodiment, the advancing directions of both of the signal light and the reference light are deflected by the physical optic elements $94a$ and $94b$ of the wafer by a predetermined angle $\theta$ ($=5$ degrees) as viewed in the x-z section. Thus, upon completion of the mask-to-wafer alignment, as viewed in the x-z section there is a lateral shift or deviation between the central axis of the sensor within an alignment head and the central axis of the grating lens system of the mask and wafer. Also, at this time, a Fraunhofer diffraction pattern from the alignment mark within a scribe line on the mask surface, for example, is formed, like that shown in FIG. 17, wherein a Fraunhofer diffraction pattern F corresponding to the aperture shape of the mark is separated from the signal light $97a$ and the reference light $97b$, in a section containing the sensor surface in the alignment head such that only the signal light and the reference light impinge upon the sensor.

In accordance with the present embodiment, a first and second alignment marks and a first and second reference marks are provided in portions of a first and second objects, respectively, and by using lights influenced by these marks the relative position of the first object (e.g. mask) and the second object (e.g. wafer) is made. Even if the position of the center of gravity of the alignment light displaces due to any inclination of the wafer surface as a whole or due to any local surface inclination of the same resulting from unevenness in the resist coating, distortion or flexure caused during an exposure process, or otherwise, detecting the relative position of the centers of gravities of the reference signal light and the alignment signal light (namely, detecting the interval between the gravity centers of these lights in the x direction, for example) can easily cancel such an inclination of the wafer surface. As a result, it is possible to correctly detect a positional deviation without being affected by such a wafer surface inclination.

If the relative position of the alignment head to the mask changes for some reason to cause shift of the position of the center of gravity of the alignment signal light upon the sensor, this can be easily compensated for by detecting the relative position of the gravity centers of the reference light and the alignment light. Thus, it is possible to correctly detect a relative positional deviation of the mask and the wafer without being affected by a positional error of the alignment head.

As described, the concept of the present invention is conveniently applicable to an occasion where the position detection is made by using two types of lights.

Figure 19D:
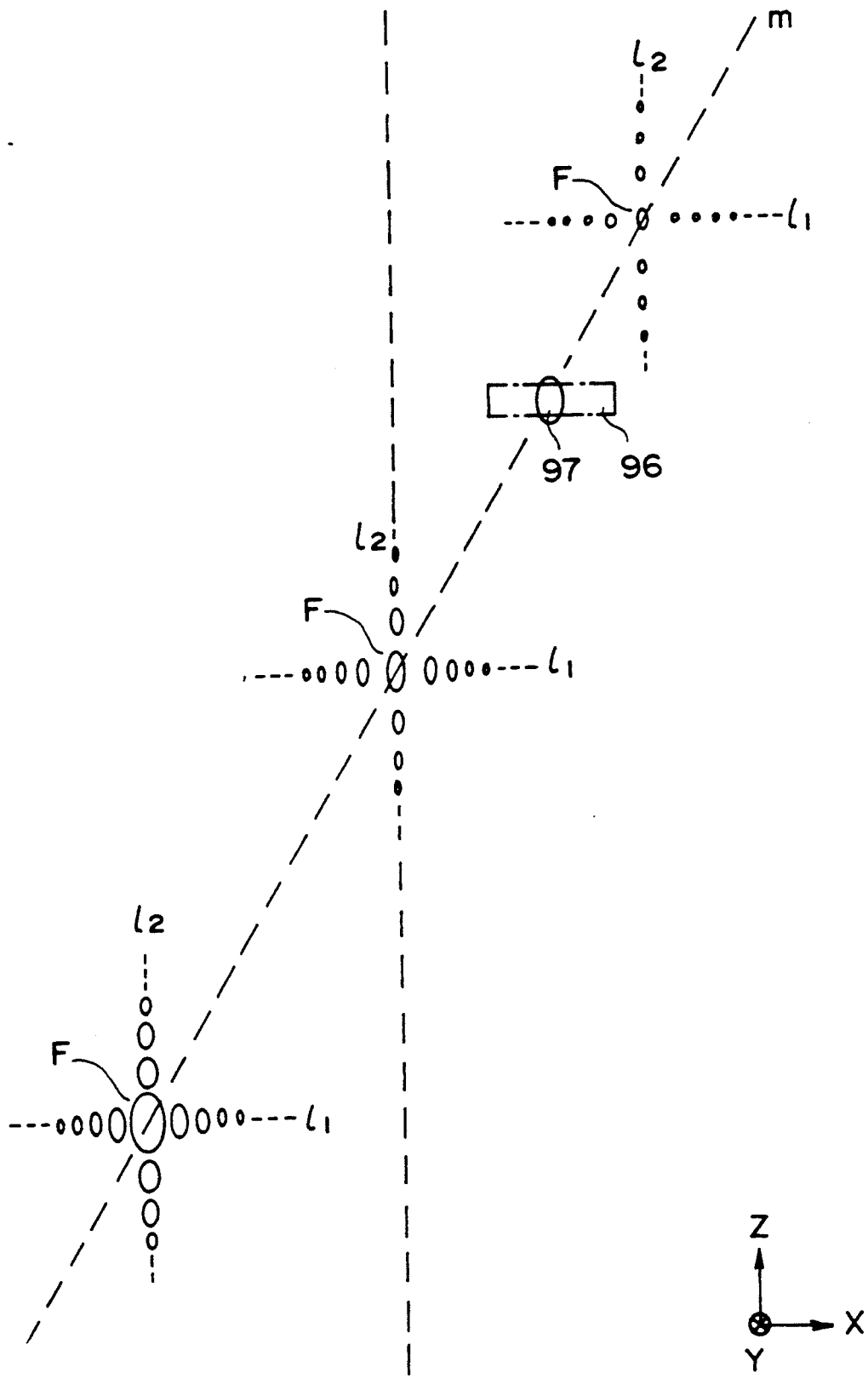

FIGS. 19A–19D are schematic representations, illustrating a major portion of a seventh embodiment of the present invention. More specifically, FIG. 19A is an x-z section of marks 94 and 93, FIG. 19B is a y-z section, FIG. 19C is a plan view in the direction of z-axis, and FIG. 19D is an illustration showing the relationship between a sensor 96 and diffraction patterns in a plane containing the sensor 96 surface.

In this embodiment, the angle of incidence and the angle of emission of an alignment light 97 upon and from a grating lens 94 are 17.5 degrees and zero degree, respectively; the angle of emission of the alignment light 97 from another grating lens 93 is 13 degrees; and a projection component upon the x-y plane of the light emanating from the grating lens 93 and a projection component on the same plane of the light entering the grating lens 94 each defines an angle of 4 degrees with respect to the y axis. In this case, where a mask and a wafer have no relative positional deviation, the path of light emanating from the grating lens 93 lies in a plane which contains the path of incidence of the alignment light 97 upon the grating lens 94 as well as a normal to the mask surface.

The grating lens 94 has an aperture shape of rectangular configuration having sides parallel to the x and y axes, respectively. The projection component of incident light on the mask surface is inclined, as described, with respect to these sides of the aperture. As a result, in the plane containing the sensor 96 surface the line m (FIG. 19D) connecting the centers of main lobes of unwanted diffraction patterns of different diffraction orders is rotationally shifted and thus inclined with respect to the z axis. In FIG. 19D, the illustrated patterns are, in the order from the below, a Fraunhofer diffraction image formed by zero-th order diffraction by the grating lens 94, a Fraunhofer diffraction image of the first order diffraction by the lens 94 and a Fraunhofer diffraction image of second order diffraction by the lens 94. In each Fraunhofer diffraction image, there is a Fraunhofer side lobe distributed along two lines $l_1$ and $l_2$ determined by the shape of the aperture. The position of the sensor 96 is determined in the state of optical paths as described so as to step aside from the main lobes of diffraction lights of different orders as illustrated in FIG. 19D and, as a result of which, it is possible to avoid reception of side lobes.

Figure 20A:
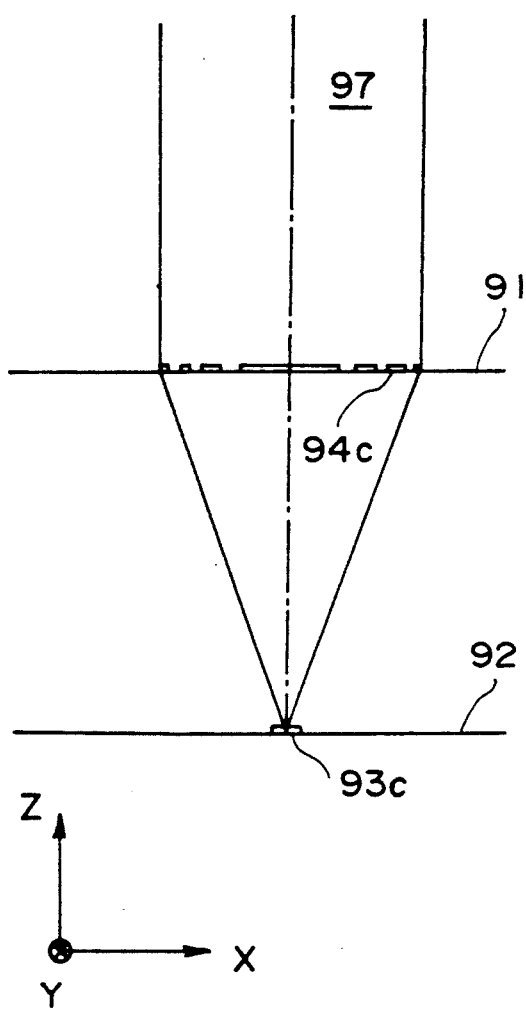
FIGS. 20A–20D are schematic representations, respectively, for explicating a major portion of an eighth embodiment of the present invention.
Figure 20B:
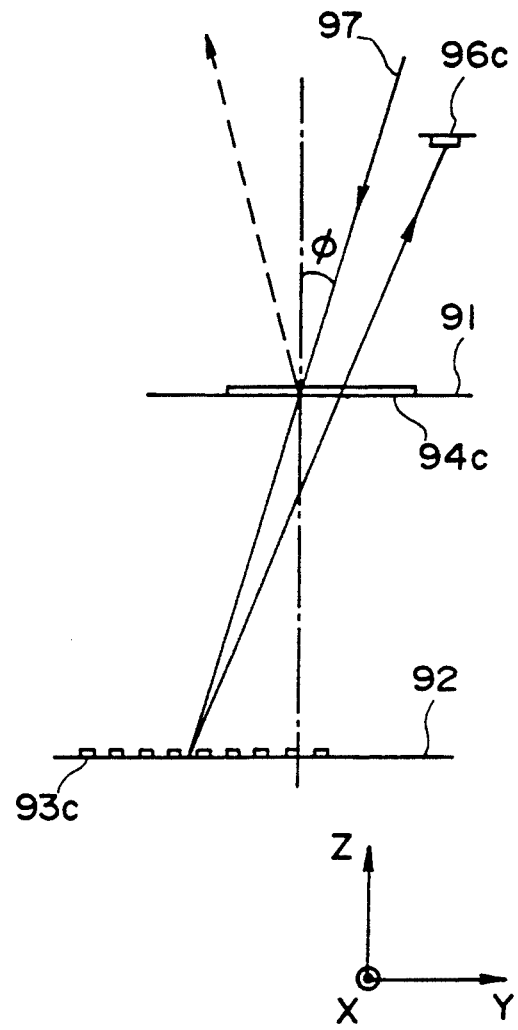
Figure 20C:
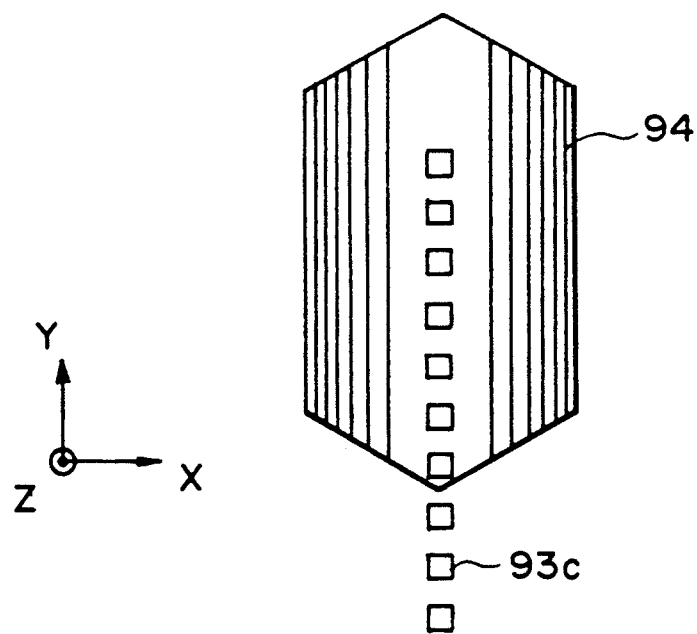
Figure 20D:
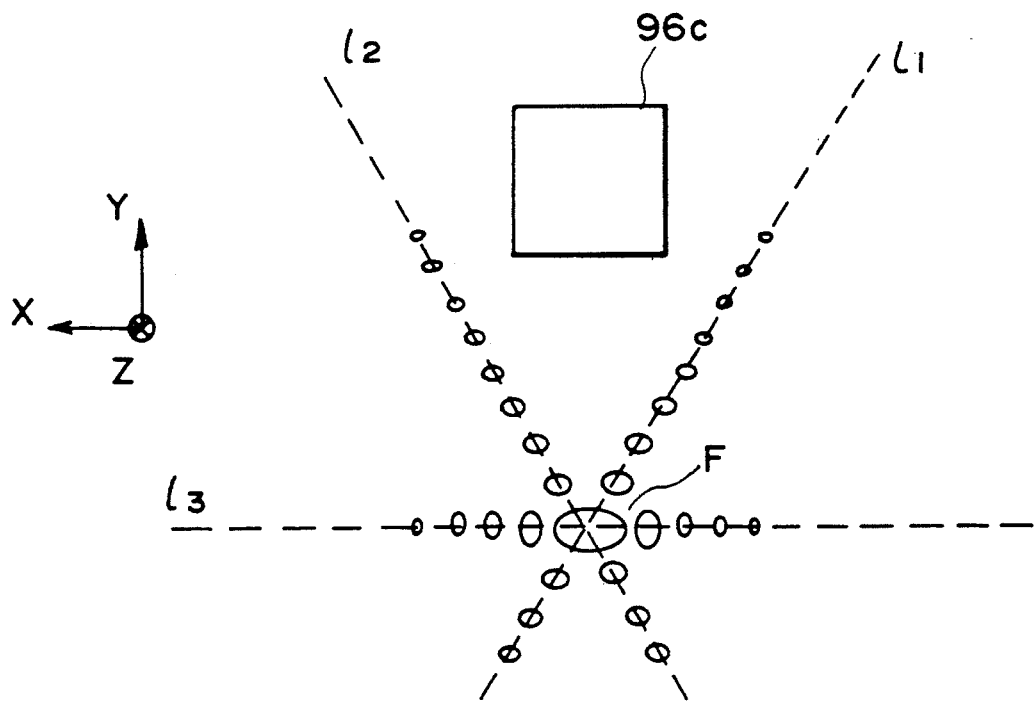

FIGS. 20A–20D are schematic representations, explicating a major portion of an eighth embodiment of the present invention. More specifically, FIG. 20A is an x-z section of alignment patterns 94c and 93c, FIG. 20B is a y-z section, FIG. 20C is a plan view in the direction of a z axis, and FIG. 20D is an illustration showing the relationship between a sensor 96c and a diffraction pattern in the plane containing the sensor 96c surface.

In this embodiment, an alignment mark 94c provided on a mask 91 is a cylindrical grating lens (linear zone plate) having a lens function only in the x direction and having a focal length in the x-z plane which is substantially equal to a set interval between the mask 91 and a wafer 92. The wafer 92 is provided with an alignment mark 93c which comprises a diffraction grating provided by rectangular gratings arrayed at regular intervals in the y direction (FIG. 20C). The direction in which the linear zone plate 94c has a power (lens function), i.e. the x direction in this example, is the direction of alignment detection. A parallel light is projected upon the linear zone plate 94c along a plane, containing a normal to the mask 91 surface at the center of the alignment mark as well as containing a direction perpendicular to the direction of alignment detection, and at a certain angle $\phi$ to that normal. By the zone plate, the incident light is focused as a linear image upon the wafer 92 surface. Sensor 96c is disposed at a site to receive diffraction light of a predetermined order or orders emanating from the diffraction grating 93c as it is irradiated with the linearly focused light from the zone plate 94c. In this example, the sensor 96c is positioned so that its center lies in the y-z plane, containing the center of the grating lens 94c, to assure reception of diffraction light advancing in a predetermined direction in the y-z plane. If the diffraction grating 93c and the grating lens 94c are relatively shifted in the x direction, the intensity of diffraction light produced by the diffraction grating 93c decreases, with a result of reduced light quantity detected by the sensor 96c. Thus, by scanning the diffraction grating 93c with the linearly focused light and by detecting or monitoring changes in the light quantity by using the sensor 96c, it is possible to detect relative positional deviation of the mask and the wafer in the x direction.

In that occasion, zero-th order reflective diffraction light is emitted from the grating lens 94c in a direction as depicted by a broken line in FIG. 20B, and about this, there is produced a Fraunhofer diffraction image which can be viewed in the plane containing the sensor 96c surface, as illustrated in FIG. 20D. If a portion of the side lobe of the diffraction image enters the sensor 96c, it produces a change in light quantity as received by the sensor 96 and, therefore, adversely affects the precision of positional error detection which relies on detection of light quantity. In the present embodiment, in consideration thereof, the alignment mark 94c is shaped into a hexagonal, like the FIG. 11 embodiment, to assure that the side lobe is distributed as illustrated in FIG. 20D. Thus, it is ensured that substantially no unwanted diffraction light is received by the sensor 96c. However, the mark configuration is not limited to that illustrated. Any other forms are usable. For example, the one as used in a foregoing embodiment may be used. Further, while using a rectangular-shaped mark, the direction of light reception or the direction of projection of light upon a mark may be adjusted, in the manner described hereinbefore, for example.

In the foregoing examples, a diffraction grating provided on a second object side is of a reflective diffraction type. If, however, the second object has a light transmissibility, the diffraction grating to be provided on such a second object may be of transmissive diffraction type. FIGS. 21A–21D show such an embodiment. More specifically, FIG. 21A is an x-z section of alignment patterns 94 and 93, FIG. 21B is a y-z section, FIG. 21C is a plan view in the direction of a z axis, and FIG. 21D is an illustration showing the relationship between a sensor 96 and diffraction light as viewed in the plane containing the sensor 96 surface, all in accordance with a ninth embodiment of the present invention.

In this embodiment, each of grating lenses 93 and 94 has a rectangular shape, and an alignment light 97 is projected in a direction which is perpendicular to one side (x-direction side, in this example) of the rectangular aperture. The light transmissively diffracted by the grating lenses 94 and 93 and thus influenced by the lens functions of them is directed to and received by a signal detecting region 96d of the sensor 96 surface as an alignment light. On the basis of the position of incidence of the alignment light upon the sensor 96 surface, any relative positional deviation of the first and second objects 91 and 92 in a direction perpendicular to the opposing direction of these objects can be detected. In that case, the light is emitted from the grating lens 94 in a direction which is inclined with respect to a side of the rectangular aperture extending in the x direction. The positional relationship between the sensor 96 which is provided to receive such an emerging light and a Fraunhofer diffraction image F (noise) produced by the grating lens 94, is such as represented in FIG. 21D. The illustrated Fraunhofer diffraction images are, in an order from the below, a diffraction image formed by zero-th order diffraction light from the grating lens 94 and a diffraction image formed by first order diffraction light therefrom. In this embodiment, as in the FIG. 14 embodiment, the direction of emission of the alignment light is inclined so that the position of the sensor 96 receiving the alignment light is stepped aside from the side lobe. In the illustration of FIG. 21D, a portion of the side lobe of the first order diffraction light reaches the sensor 96. However, the advantageous results of the present invention are attainable in that case by shifting, from the received side lobe portion, a zone for use in the actual deviation detection (i.e. signal detecting zone) of the sensor 96 at the stage of signal processing, for example.

While in the foregoing embodiments, description has been made of a method and apparatus for detecting a relative positional deviation between first and second objects (mask and wafer) in a direction perpendicular to the direction in which these objects are opposed to each other, the concept of the present invention is applicable also to a measuring method and apparatus for measuring the positional relationship between first and second objects in the direction in which these objects are opposed (namely, for measurement of the interval between these objects).

Some embodiments for such interval measurement will be described below.

FIGS. 22A through 22D are schematic representation explicating a major portion of a tenth embodiment of the present invention. FIG. 22A is an x-z section, FIG. 22B is a y-z section, FIG. 22C is a plan view in a z direction, and FIG. 22D is an illustration showing the relationship between a light receiving means and diffraction light in a plane containing the light receiving means.

Denoted in FIGS. 22A through 22D at 101 is a light from a semiconductor laser LD. He-Ne laser or otherwise may be used in place of the semiconductor laser LD. Denoted at 102 is a first object which is a mask, for example. Denoted at 103 is a second object which is a wafer, for example. Denoted at 104 and 105 are first and second physical optic elements which are provided in a portion of the mask 102. Each of these physical optic elements 104 and 105 may comprise a diffraction grating or a zone plate, for example. Denoted at 108 is a light receiving means which may comprise a line sensor or PSD, for example, and which is operable to detect the position of the center of gravity of a received light. Signal processing circuit 109 functions to determine, by using signals from the light receiving means 108, the position of the center of gravity of the light incident upon the light receiving means 108, and also functions to detect by calculation the interval between the mask 2 and the wafer 3.

The light 101 (wavelength λ=830 nm in this example) from the semiconductor laser LD is perpendicularly incident at a point A on the surface of a first Fresnel zone plate provided in a portion of the mask 102. The light incident on the first Fresnel zone plate 104 is diffracted thereby, and diffraction light of a predetermined order or orders, being diffracted at an angle $\theta 1$, is reflected at a point B FIG. 22C on the wafer 103 surface. Reference numeral 131 denotes such a reflection light from the wafer 103 when it is at a position P1 which is at a distance (interval) $d_0$ from the mask 102. Reference numeral 132 denotes such a reflection light from the wafer 103 when it is at a position P2 which is at a distance $d_G$ from the position P1.

The reflected light from the wafer 103 is incident at a point D (or E as the wafer 103 is at the position P2) on the surface of a second Fresnel zone plate 105 provided in a portion of the first object (mask) 102.

The second Fresnel zone plate 105 has an optical function by which the angle of emission of a diffraction light emanating therefrom changes in accordance with the position of incidence of light impinging on the second Fresnel zone plate, like a function of a condensing lens. The second Fresnel zone plate has a focal length $f_M$.

Diffraction light 161 (or 162 as the wafer 103 is at the position P2) of a predetermined order or orders, being diffracted from the second Fresnel zone plate 105, is directed onto the surface of the light receiving means 108. By using the position of the center of gravity of the received light 161 (or 162) on the surface of the light receiving means 108, the gap or interval between the mask 102 and the wafer 103 can be detected by calculation.

In this embodiment, the first Fresnel zone plate 104 has a function simply for deflecting a received light. However, it may have a light converging or diverging function.

The manner how to measure the interval will now be explained in detail. Where the distance from the focal point position of the Fresnel zone plate 105 to the light receiving means is denoted by $l_s$ and the amount of shift of light upon the light receiving means 108 as the wafer position is displaced from the position P1 to the position P2 is denoted by S, then the following relationship is derived:

$$S = DE \cdot (l_s/f_M)$$

where
AD = $2d_0 \tan\theta 1$,
AE = $2(d_0 + dG)\tan\theta 1$,
∴ $d_M$ = DE = AE − AD = $2d_G \tan\theta 1$ It follows therefrom that:

$$S = [2(l_s/f_M) \cdot \tan\theta 1] d_G$$

The values $l_s$, $f_M$ and $\theta 1$ can be detected in preparation. Thus, by detecting the shift S of light upon the light receiving means, the distance $d_G$ can be determined in accordance with the above equation. Thus, it is possible to determine the interval between the mask and the wafer. In this occasion, where a large value is selected for the distance $l_s$, the magnitude of the shift S to the distance $d_G$ can be made large, such that only a minute amount of gap change can be converted into and detected as an enlarged amount of shift of light.

The position of incidence upon the light receiving means 108 of the light from the second Fresnel zone plate 105, as the wafer 103 is at a desired interval $d_0$, is used as a reference position as seen from the foregoing description. Such reference position can be easily determined in preparation. For example, a suitable means may be used to set a wafer exactly at a predetermined interval ($d_0$) from a mask, and light may be projected from the light source LD. Thus, such position on the light receiving means 108 at which the light from the second Fresnel zone plate 105 impinges may be determined as the reference position. As an example, for the setting of the wafer, a measuring apparatus "TM-230N" (trade name: manufactured by Canon Inc. Japan) may be conveniently used.

In this embodiment, like the FIG. 12 embodiment, the alignment mark is shaped into a hexagonal to assure that the side lobe of the diffraction light goes aside the light receiving means. Fraunhofer diffraction image pattern F and a signal light 161 obtainable in that occasion are shown in part (d) of FIG. 22. Unwanted diffraction light distribution as the projected light 101 irradiates the whole of the zone plate 104 and then the whole of the zone plate 105 is such as illustrated, and it is seen that the unwanted diffraction light is not incident on the signal detecting zone 108a of the light receiving means 108. In this embodiment, any Fraunhofer diffraction image formed by diffraction light of any order other than the zero-th order diffraction by the patterns 104 and 105 goes far away from the signal detecting zone 108a. Therefore, such component is not illustrated in the drawing. While a portion of the side lobe may reach the light receiving means 108, the signal detecting zone can be easily set to exclude that part of the light receiving means 108.

FIGS. 23A through 23D are schematic representations explicating a major portion of an eleventh embodiment of the present invention. More specifically, FIG. 23A is an x-z section, FIG. 23B is a y-z section, FIG. 23C is a plan view in the direction of z axis, and FIG. 23D is an illustration showing the relationship between a light receiving means and diffraction light as seen in the plane containing the surface of the light receiving means. Like the FIG. 22A through 22D embodiment, this embodiment is concerned with a gap measuring method and apparatus. However, Fresnel zone plate 104 and 105 used in this embodiment each has a rectangular shape. Further, in order to avoid reception by a light receiving means 108 of a Fraunhofer diffraction image of zero-th order diffraction light from the Fresnel zone plates 104 and 105, the angle of emission of light from the Fresnel zone plate 105 as well as the position of the signal detecting zone 108a of the light receiving means, for receiving the light from the Fresnel zone plate 105, are adjusted in a specific manner as illustrated. This assures that, as in the FIG. 21 embodiment, the signal detecting zone 108a of the light receiving means 108 can be stepped aside from the side lobe of the Fraunhofer diffraction image F. This is best seen in FIG. 23D.

FIGS. 24A through 24D are schematic representations, explicating a major portion of a twelfth embodiment of the present invention, wherein FIG. 24A is an x-z section, FIG. 24B is a y-z section, FIG. 24C is a plan view in the direction of z axis, and FIG. 24D is an illustration showing the relationship between a light receiving means and diffraction light as seen in the plane containing the light receiving means. Like the FIG. 23A through 23D embodiment, this embodiment is concerned with an interval measuring method and apparatus. In this embodiment, however, the direction of advancement of the signal light 101 is adjusted so as to ensure that a Fraunhofer diffraction image of zero-th order diffraction light from Fresnel zone plate 104 and 105 do not enter the signal detecting zone 108a of the light receiving means 108. As seen from the drawing, the light receiving means having the signal detecting zone 108a is provided at a site which is in a direction perpendicular to a side of the Fresnel zone plate 104 or 105 parallel to the x direction. The light 101 is incident upon the Fresnel zone plate with an inclination with respect to a side along the x direction. This assures that the position of the Fraunhofer diffraction image F is deviated from the signal detecting zone 108a, as best seen in part (d) of FIG. 24D.

FIGS. 25A through 25D are schematic representations, explicating a major portion of a thirteenth embodiment of the present invention, wherein FIG. 25A is an x-z section, FIG. 25B is a y-z section, FIG. 25C is a plan view in the direction of the z axis, and FIG. 25D is an illustration showing the relationship between a light receiving means and diffraction light as seen in the plane containing the light receiving means. As compared with the FIGS. 24A through 25D embodiment, in this embodiment the direction of advancement of an emanating light as well as the position of the signal detecting zone are adjusted additionally. More particularly, the optical arrangement is set so that both the projection components upon the mask 102 surface of the direction of incidence of light and the direction of emission of the light to the signal detecting zone are inclined at the same angle with respect to a side extending in the x direction. The relationship between a produced Fraunhofer diffraction image F and the signal detecting zone 108a in that case is such as illustrated in part FIGS. 25D.

Figure 26A:
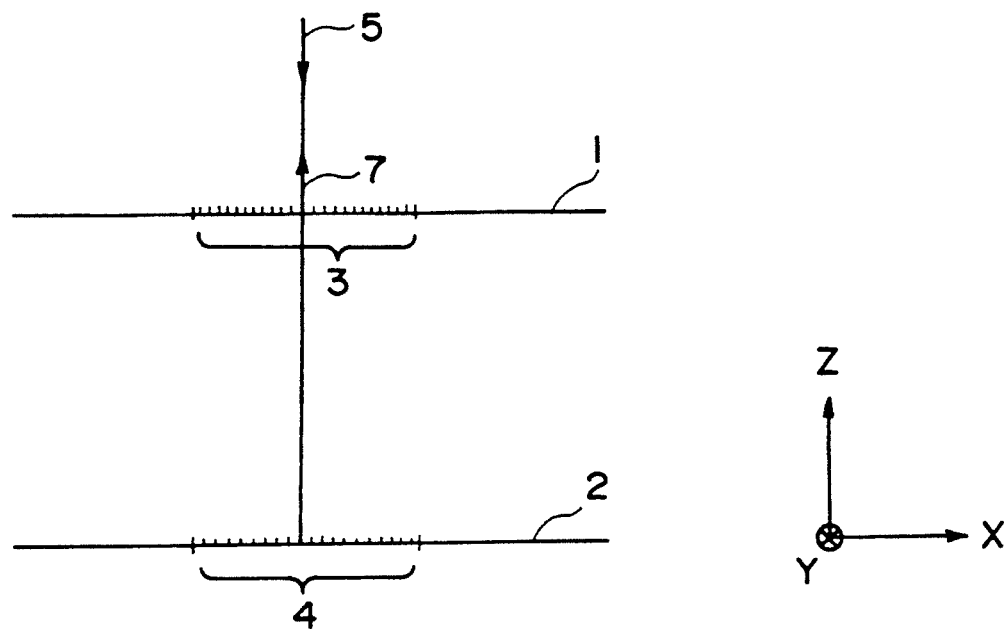
FIGS. 26A, 26B, 26C and 26D are schematic representations, respectively, for explicating a major portion of a fourteenth embodiment of the present invention.
Figure 26B:
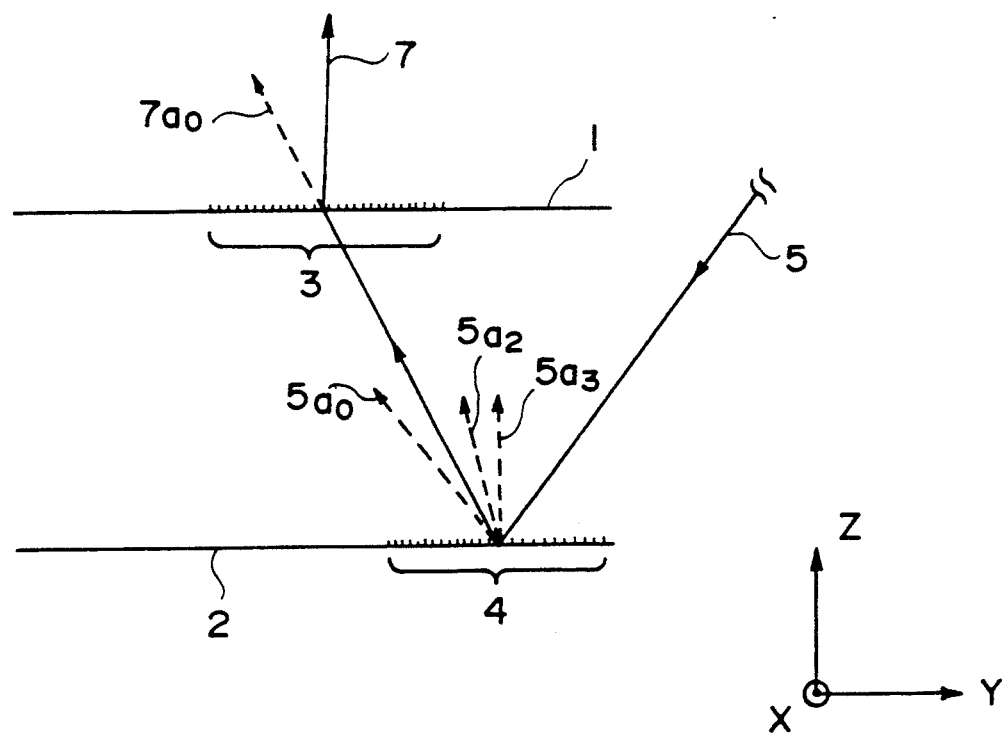
Figure 26C:
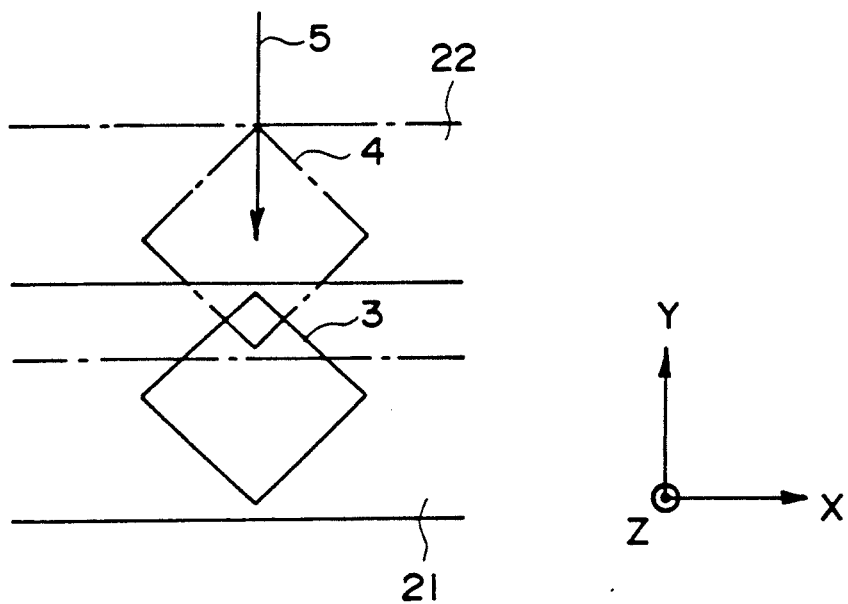
Figure 26D:
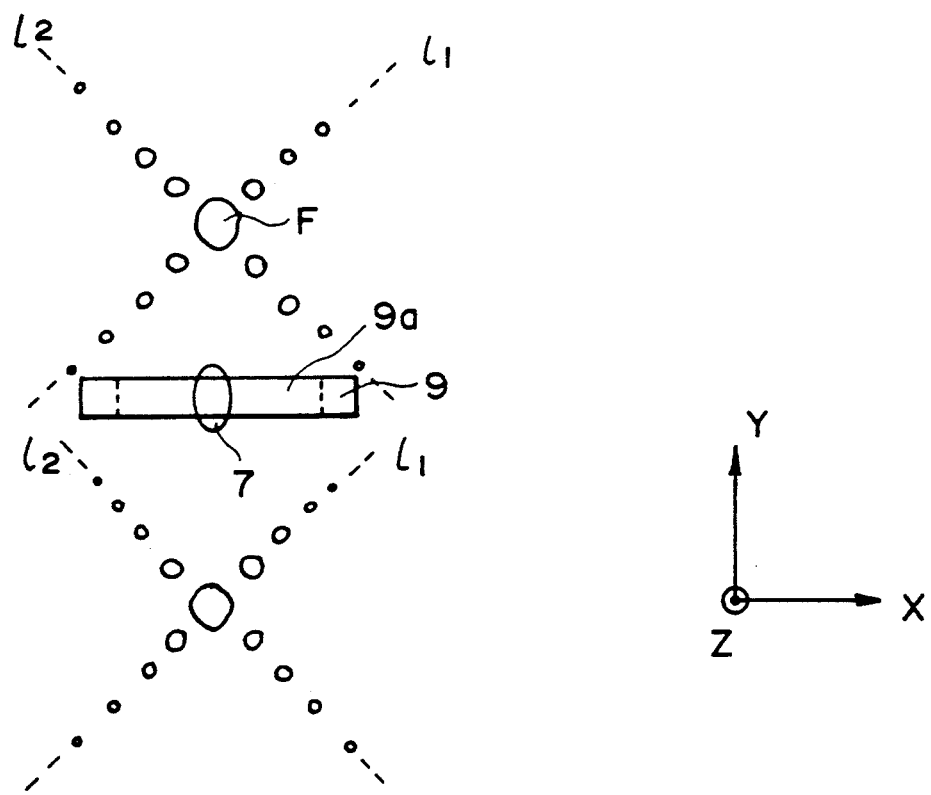

FIGS. 26A–26D are schematic representations, for explicating a major portion of a fourteenth embodiment of the present invention. More specifically, FIG. 26A is an x-z section, FIG. 26B is a y-z section, FIG. 26C is a plan view in the direction of z axis, and FIG. 26D is an illustration showing the relationship between a detector 9 and diffraction light as seen in the plane containing the detector 9 surface. Like the FIG. 8 embodiment, in this embodiment two physical optic elements 3 and 4 each is disposed with inclination with respect to a scribe line 21 or 22. In this embodiment, however, a projected light 5 first impinges on a physical optic element 4, and first order diffraction light emanating therefrom impinges on the other physical optic element 3 to produce an emanating diffraction light 7. Reference characters $5a_0$, $5a_2$ and $5a_3$ denote reflective diffraction lights of zero-th order, second order and third order at the physical optic element 4, respectively. Reference character $7a_0$ denotes nondiffracted transmission light at the physical optic element 3. Each of the physical optic elements 3 and 4 of rectangular shape has sides each being inclined at an angle 45 degrees with respect to the direction of a scribe line. As a result, there can be established a positional relationship between Fraunhofer diffraction images and the signal detecting zone 9a of the detector 9 surface such as illustrated in FIG. 26D, whereby it is possible to prevent the side lobe or lobes from entering the signal detecting zone 9a. In FIG. 26D, illustrated Fraunhofer diffraction images are, in an order from the below, one produced by second order diffraction light and one produced by third order diffraction light at the physical optic element 4, these diffraction images being depicted as unwanted diffraction lights closest to the detector 9 surface. As described, the concept of the present invention is applicable, with similar advantageous effects, to a system wherein light is projected first upon a diffraction grating on the wafer side.

Figure 27A:
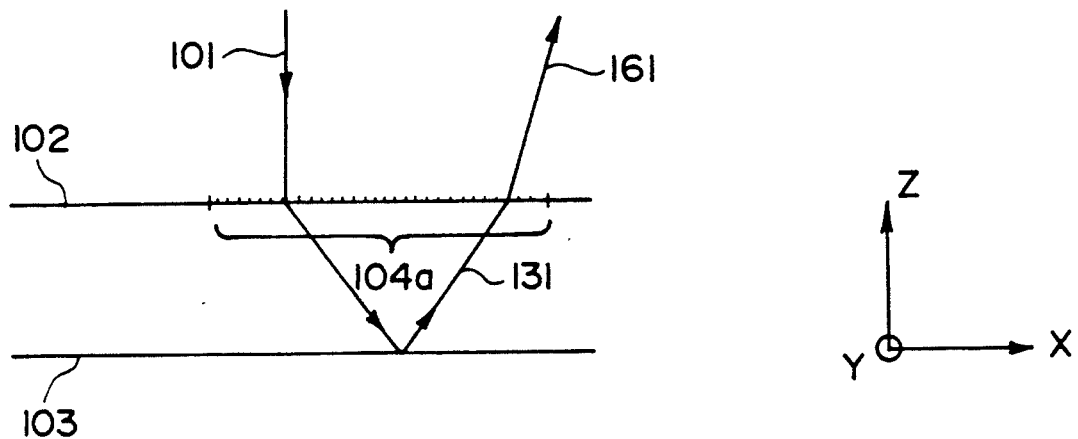
FIGS. 27A, 27B, 27C and 27D are schematic representations, respectively, explicating a major portion of a fifteenth embodiment of the present invention.
Figure 27B:
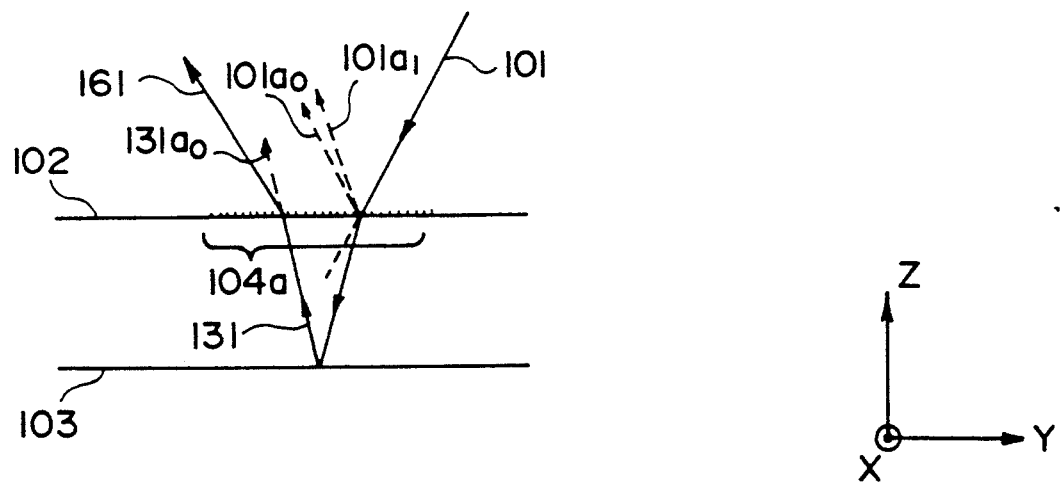
Figure 27C:
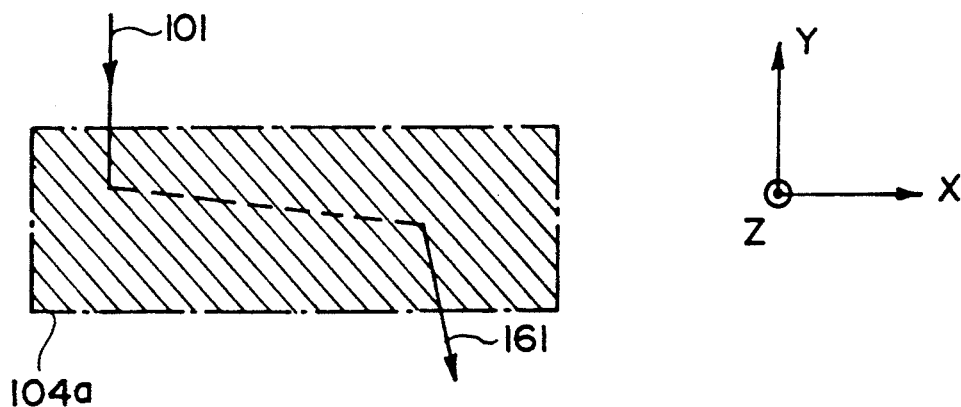
Figure 27D:
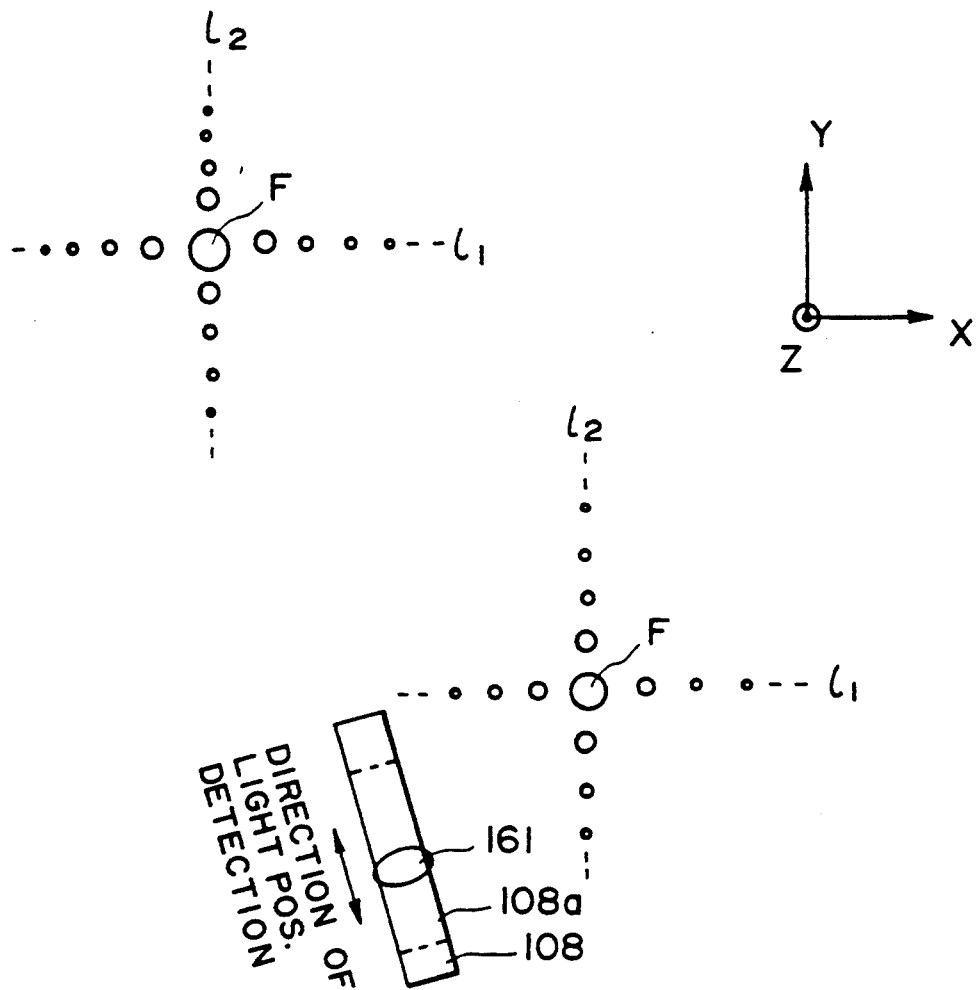

FIGS. 27A-27D are schematic representations, explicating a major portion of a fifteenth embodiment of the present invention, wherein FIG. 27A is an x-z section, FIG. 27B is a y-z section, FIG. 27C is a plan view in the direction of z axis, and FIG. 27D is an illustration showing the relationship between a light receiving means and diffraction light as seen in a plane containing the light receiving means. Like the FIGS. 23A through 23D embodiment, this embodiment is concerned with an interval measuring method and apparatus. In this embodiment, however, a projected light 101 is diffracted by a diffraction grating 104a provided by straight line patterns of regular intervals. The diffracted light is reflected by a wafer 103 surface and, then, it is diffracted again by the same diffraction grating 104a toward a light receiving means 108. Such an emanating light 161 displaces upon the light receiving means 108 surface in accordance with a change in the gap between a mask 102 and the wafer 103. The gap measurement can be made by detecting the position of incidence of the light 161 upon the light receiving means 108. Reference characters $101a_0$ and $101a_1$ denote zero-th order reflective diffraction light and first order reflective diffraction light produced by the grating 104a as a result of reception of the projected light 101. Reference character $131a_1$ denotes non-diffracted transmission light (zero-th order transmissive diffraction light) produced by the grating 104a as a result of reception of light 131 reflected from the wafer 103. The grating 104a has an outer peripheral configuration of rectangular shape having sides extending in parallel to the x and y directions, respectively. The projected light 101 goes along a path which is included in the y-z plane. The light receiving means 108 has a signal detecting zone 108a which is disposed to receive the emanating light 161, emitted from the grating 104a in a direction which is not included in the y-z plane. With this arrangement, it is possible to avoid any side lobe from impinging on the signal detecting zone 108a, as best seen in FIG. 27D. As described, the present invention is applicable also to a system wherein only a single diffraction grating is used.

Figure 28C:
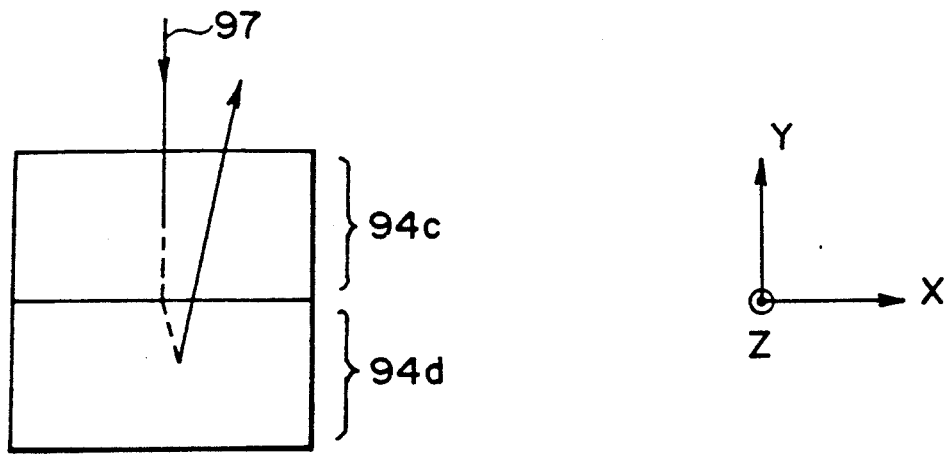
Figure 28D:
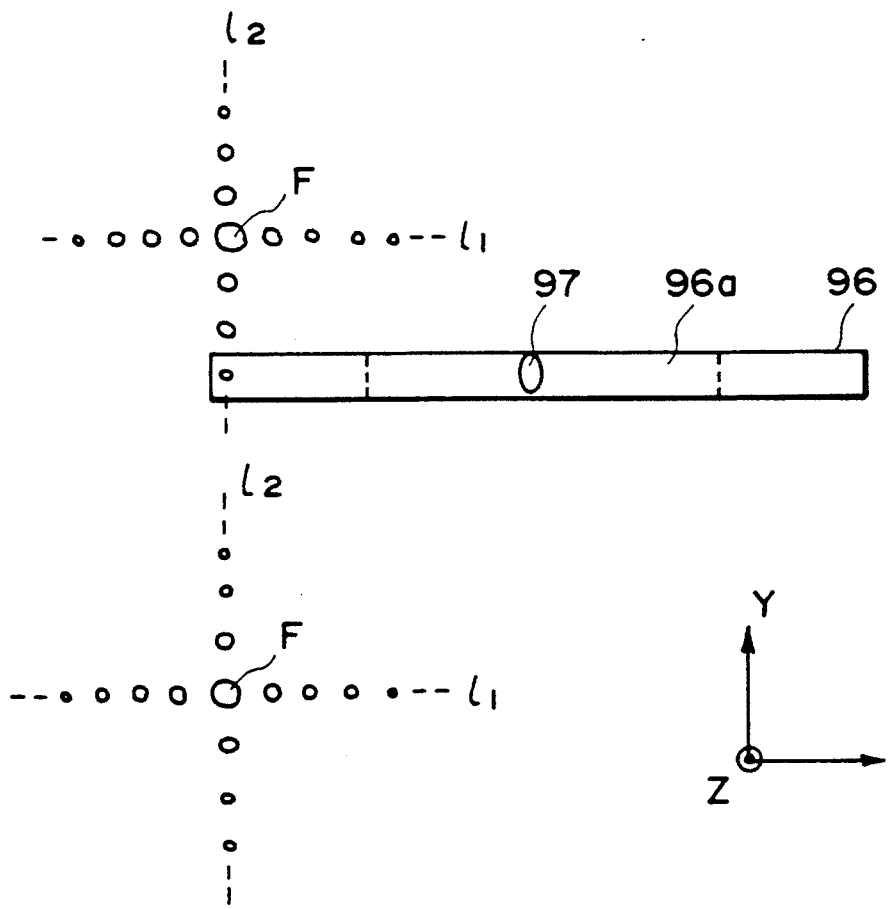

FIGS. 28A-28D are schematic representations, explicating a major portion of a sixteenth embodiment of the present invention, wherein FIG. 28A is an x-z section, FIG. 28B is a y-z section, FIG. 28C is a plan view in the direction of z axis, and FIG. 28D is an illustration showing the relationship between a sensor and diffraction light as seen in the plane containing the sensor surface. Like the FIG. 14 embodiment, this embodiment is concerned with a positional deviation detecting method and apparatus. In this embodiment, however, a mask 91 is provided with two grating lenses 94c and 94d. Alignment light 97 is projected upon the grating lens 94c, and first order diffraction light caused thereby goes as an alignment light 97 to a wafer 92 and it is diffracted again by a grating lens 93 provided in a portion of the wafer 92. First order diffraction light produced by the grating lens 93 is diffracted again by the grating lens 94d, and first order diffraction light caused at this time and emanating from the grating lens 94d is directed as an emanating alignment light to the sensor 96. The path of such an alignment light before the light impinges on the grating lens 93, is included in the y-z plane. However, by the grating lens 93, it is deflected in a direction which is not included in the y-z plane. Each of the grating lenses 94c and 94d has a rectangular shape having sides extending along the x and y directions, respectively. Further, the optical arrangement is set to provide an emanating alignment light as described. Also, signal detecting zone 94a of the sensor 96 is disposed to receive the emanating alignment light, as seen in FIG. 28D. By this, it is possible to avoid any side lobe of Fraunhofer diffraction images F of diffraction light from the grating lenses 94c and 94d, from entering the signal detecting zone 96a. In FIG. 28D, the illustrated Fraunhofer diffraction images are, in an order from the below, one produced by zero-th order diffraction light and one produced by first order diffraction light at the grating lenses 94c and 94d. As described, the present invention is applicable with similar advantageous effects, to such a system wherein three or more diffraction gratings are used or wherein light having been diffracted by three times is used for the position detection.

In the embodiments described hereinbefore, the inclined setting of straight sides of a mark, the inclined setting of direction of projection of light upon a mark and the inclined setting of the direction to a detecting means, all for preventing unwanted diffraction light from entering a signal detecting portion, may be suitably adopted singly or in combination in place of the disclosed forms.

While the invention has been described with reference to the structures disclosed herein, it is not confined to the details set forth and this application is intended to cover such modifications or changes as may come within the purposes of the improvements or the scope of the following claims.

What is claimed is:

1. A device usable with a first object and a second object at least one of which is provided with a diffraction grating, for detecting the position of the second object relative to the first object, said device comprising:

a light source for projecting a position detecting beam upon the first object;

a beam detecting portion for receiving the position detecting beam having been projected to the first object and then to the second object, and for detecting the position of incidence of the position detecting beam upon a predetermined plane to detect the position of the second object relative to the first object;

wherein at least one diffraction grating is disposed in the path of the position detecting beam to be received by said beam detecting portion, which diffraction grating is effective to diffract the position detecting beam, and wherein said beam detecting portion is disposed at a site effective to avoid reception of unwanted Fraunhofer diffraction light produced from the at least one diffraction grating.

2. A device usable with a first object and a second object at least one of which is provided with a diffraction grating, for detecting the position of the second object relative to the first object, said device comprising:

a light source for projecting a position detecting beam upon the first object;

a beam detecting portion for receiving the position detecting beam having been projected to the first object and then to the second object, and for detecting the position of incidence of the position detecting beam upon a predetermined plane to detect the position of the second object relative to the first object;

wherein at least one diffraction grating is disposed in the path of the position detecting beam to be received by said beam detecting portion, which diffraction grating is effective to diffract the position detecting beam; and wherein said beam detecting portion is disposed at a site which does not intersect with (i) a vector of a chief ray of an arbitrary diffraction light produced by and emanating from the at least one diffraction grating and (ii) an arbitrary Fraunhofer diffraction vector as determined by the at least one diffraction grating, to substantially avoid reception of unwanted Fraunhofer diffraction light by said beam detecting portion.

3. A device usable with a first object and a second object at least one of which is provided with a diffraction grating, for detecting the position of the second object relative to the first object, said device comprising:

a light source for projecting a position detecting beam upon the first object;

a beam detecting portion for receiving the position detecting beam having been projected to the first object and then to the second object, and for detecting the position of incidence of the position detecting beam upon a predetermined plane to detect the position of the second object relative to the first object;

wherein at least one diffraction grating is disposed in the path of the position detecting beam to be received by said beam detecting portion, which diffraction grating is effective to diffract the position detecting beam; and wherein said beam detecting portion is disposed at a site set for the at least one diffraction grating and out of a normal to a portion of an outer periphery of that diffraction grating, whereby entry of unwanted Fraunhofer diffraction light into said beam detecting portion is substantially avoided.

4. A device usable with a first object and a second object at least one of which is provided with a diffraction grating, for detecting the position of the second object relative to the first object, said device comprising:

a light source for projecting a position detecting beam upon the first object;

a beam detecting portion for receiving the position detecting beam having been projected to the first object and then to the second object, and for detecting the position of incidence of the position detecting beam upon a predetermined plane to detect the position of the second object relative to the first object;

wherein at least one diffraction grating is disposed in the path of the position detecting beam to be received by said beam detecting portion, which diffraction grating is effective to diffract the position detecting beam; and wherein said light source is adapted to project a beam to the at least one diffraction grating in a direction deviated from a normal to a portion of an outer periphery of that diffraction grating, whereby entry of unwanted Fraunhofer diffraction light into said beam detecting portion is substantially avoided.

5. A signal beam detecting method for use with a mark that includes a pattern and produces a signal beam and a Fraunhofer diffraction beam corresponding to the shape of the mark in response to illumination by an illumination beam, said method comprising the steps of:

producing, in response to the pattern being illuminated by the illumination beam, a signal beam in a direction different from the direction in which the Fraunhofer diffraction beam is produced, to assure separation of the signal beam and the Fraunhofer diffraction beam at a position;

defining a detection zone at the position where the signal beam is substantially separated from the Fraunhofer diffraction beam; and receiving and detecting the signal beam in the detection zone.

6. A method according to claim 5, further comprising obliquely projecting the illumination beam to the mark along a direction defining a predetermined azimuth angle with respect to a direction perpendicular to an edge of the mark, which edge at least partially defines the shape of the mark, to assure the separation of the signal beam and the Fraunhofer diffraction beam at the position.

7. A method according to claim 6, wherein the mark includes a grating pattern, and further comprising diffracting the illumination beam to produce the signal beam.

8. A method according to claim 7, further comprising providing a Fresnel zone plate pattern by the grating pattern.

9. A method according to claim 8, further comprising defining the detection zone on as light receiving surface of a photosensor, for detection of the signal beam.

10. A method according to claim 9, further comprising defining a portion of the light receiving surface of the photosensor as the detection zone.

11. A method according to claim 5, wherein the mark includes a grating pattern, and further comprising diffracting the illumination beam to produce the signal beam.

12. A method according to claim 11, further comprising providing a Fresnel zone plate pattern by the grating pattern.

13. A method according to claim 12, further comprising defining the detection zone on a light receiving surface of a photosensor, for detection of the signal beam.

14. A method according to claim 13, further comprising defining a portion of the light receiving surface of the photosensor as the detection zone.

15. A signal beam detecting system for use with a mark that includes a pattern and produces a signal beam and a Fraunhofer diffraction beam corresponding to the shape of the mark in response to illumination by an illumination beam, said system comprising:

projecting means for projecting the illumination beam to the mark to produce a signal beam in a different direction from the direction in which the Fraunhofer diffraction beam is produced, to assure separation of the signal beam and the Fraunhofer diffraction beam at a position; and light receiving means including a light receiving surface having a zone disposed at the position where the signal beam is substantially separated from the Fraunhofer diffraction beam.

16. A system according to claim 15, wherein said projecting means comprises means for obliquely projecting the illumination beam to the mark along a direction defining a predetermined azimuth angle with respect to a direction perpendicular to an edge of the mark, which edge at least partially defines the shape of the mark.

17. A system according to claim 15, wherein said projecting means comprises means for projecting the illumination beam to the mark along a predetermined direction to produce the signal beam from the pattern of the mark in a direction different from the direction in which the Fraunhofer diffraction beam is produced.

18. A system according to claim 15, wherein said zone comprises a portion of the light receiving surface of said light receiving means.

19. A method of detecting a position of a substrate relative to a predetermined object, wherein a grating mark includes a pattern and is provided on the substrate, which mark diffracts an illumination beam to produce a signal beam and a Fraunhofer diffraction beam corresponding to the shape of the mark, and wherein the relative position of the substrate is detected on the basis of the signal beam produced by the mark, said method comprising the steps of:

producing, in response to being illuminated by the illumination beam, a signal beam in a direction different from the direction in which the Fraunhofer diffraction beam is produced, to assure separation of the signal beam and the Fraunhofer diffraction beam at a position;

determining the position where the signal beam is substantially separated from the Fraunhofer diffraction beam;

defining a detection zone at the determined position; and detecting the signal beam incident on the detection zone to detect the relative position of the substrate.

20. A method according to claim 19, wherein the mark has such an optical power that the position of incidence of the signal beam on the detection zone changes with the position of the substrate.

21. A method according to claim 19, wherein the mark has such a pattern that the intensity of the signal beam on the detection zone changes with the position of the substrate.

22. A method according to claim 19, further comprising obliquely projecting the illumination beam to the mark along a direction defining a predetermined azimuth angle with respect to a direction perpendicular to an edge of the mark, which edge at least partially defines the shape of the mark, to assure the separation of the signal beam and the Fraunhofer diffraction beam at the position.

23. A position detecting method for use with first and second substrates, for detecting the position of the second substrate relative to the first substrate, wherein a first zone plate mark is provided on the first substrate, which mark diffracts an illumination beam to produce a Fraunhofer diffraction beam corresponding to the shape of the mark, a second zone plate mark is provided on the second substrate, which mark diffracts the illumination beam, a signal beam is produced under the influence of optical powers of the first and second zone plate marks in response to illumination of the first and second substraters and position of the second substrate relative to the first substrate is detected on the basis of the signal beam, said method comprising the steps of:

determining a position where the signal beam is substantially separated from the Fraunhofer diffraction beam;

defining a detection zone at the determined position; and detecting the signal beam incident on the detection zone to detect the position of the second substrate relative to the first substrate.

24. A method according to claim 23, further comprising obliquely projecting the illumination beam to the first zone plate mark along a direction defining a predetermined azimuth angle with respect to a direction perpendicular to an edge of the first zone plate mark, which edge at least partially defines the shape of that mark, to assure the separation of the signal beam and the Fraunhofer diffraction beam at the position.

25. A method according to claim 23, wherein the first zone plate mark includes a pattern, and further comprising producing, in response to the pattern being illuminated by the illumination beam, a signal beam in a direction different from the direction in which the Fraunhofer diffraction beam is produced, to assure the separation of the signal beam and the Fraunhofer diffraction beam at the position.

26. A position detecting method for use with first and second substrates, for detecting the position of the second substrate relative to the first substrate, wherein a zone plate mark including a pattern and is provided on the first substrate, which mark diffracts an illumination beam to produce a Fraunhofer diffraction beam corresponding to the shape of the zone plate mark, a diffraction grating mark is provided on the second substrate, which mark diffracts the illumination beam, a convergent beam produced in response to the illumination of the zone plate mark is diffracted by the diffraction grating mark to produce a signal beam and the position of the second substrate relative to the first substrate is detected on the basis of the signal beam, said method comprising the steps of:

producing, in response to the pattern being illuminated by the illumination beam, a signal beam in a direction different from the direction in which the Fraunhofer diffraction beam is produced, to assure separation of the signal beam and the Fraunhofer diffraction beam at a position;

determining the position where the signal beam is substantially separated from the Fraunhqfer diffraction beam;

defining a detection zone at the determined position; and detecting the signal beam incident on the detection zone to detect the position of the second substrate relative to the first substrate.

27. A method according to claim 26, further comprising obliquely projecting the illumination beam to the zone plate mark along a direction defining a predetermined azimuth angle with respect to a direction perpendicular to an edge of the zone plate mark, which edge at least partially defines the shape of that mark, to assure the separation of the signal beam and the Fraunhofer diffraction beam at the position.

28. A method of detecting a gap between first and second substrates, wherein the first substrate is provided with a grating mark that includes a pattern and diffracts an illumination beam to produce a signal beam that is obliquely projected to the second substrate and a Fraunhofer diffraction beam corresponding to the shape of the mark and the gap between the first and second substrates is detected on the basis of the signal beam reflected by the second substrate, said method comprising the steps of:
- producing, in response to the pattern being illuminated by the illumination beam, a signal beam in a direction different from the direction in which the Fraunhofer diffraction beam is produced, to assure separation of the signal beam and the Fraunhofer diffraction beam at a position;
- determining the position where the signal beam is substantially separated from the Fraunhofer diffraction beam;
- defining a detection zone at the determined position; and
- detecting the signal beam incident on the detection zone to detect the gap between the first and second substrates.

29. A method according to claim 28, further comprising obliquely projecting the illumination beam to the mark along a direction defining a predetermined azimuth angle with respect to a direction perpendicular to an edge of the mark, which edge at least partially defines the shape of the mark, to assure the separation of the signal beam and the Fraunhofer diffraction beam at the position.

30. A method according to claim 28, further comprising providing the first substrate with a zone plate mark adjacent to the grating ark and diffracting the signal beam by the zone plate mark toward the detection zone.

31. A semiconductor device manufacturing method, wherein a mask is provided with a first grating mark that includes a pattern and diffracts and illumination beam to produce a Fraunhofer diffraction beam corresponding to the shape of the mark, a wafer is provided with a second grating mark that diffracts the illumination beam, any positional deviation of the wafer relative to the mark is detected on the basis of a signal beam produced in response to diffraction of the illumination beam by the first and second grating marks, and after aligning the mask and the wafer, the wafer is exposed to a pattern of the mask, said method comprising the steps of:
- producing, in response to the pattern being illuminated by the illumination beam, a signal beam in a direction different from the direction in which the Fraunhofer diffraction beam is produced, to assure separation of the signal beam and the Fraunhofer diffraction beam at a position;
- determining the position where the signal beam is substantially separated from the Fraunhofer diffraction beam;
- defining a detection zone at the determined position; and
- detecting the signal beam incident on the detection zone.

32. A method according to claim 31, wherein the first and second grating marks have such optical powers that the position of incidence of the signal beam upon the detection zone changes with the positional deviation.

33. A method according to claim 31, wherein the first and second grating marks have such patterns that the intensity of the signal beam on the detection zone changes with the positional of the substrate.

34. A method according to claim 31, further comprising obliquely projecting the illumination beam to the mark along a direction defining a predetermined azimuth angle with respect to a direction perpendicular to an edge of the mark, which edge at least partially defines the shape of the mark, to assure the separation of the signal beam and the Fraunhofer diffraction beam at the position.

35. An exposure apparatus for exposing a wafer to a pattern of a mask, wherein the mask is provided with a first grating mark that includes a pattern and diffracts an illumination beam to produce a Fraunhofer diffraction beam corresponding to the shape of the mark and the wafer is provided with a second grating mark that diffracts the illumination beam, said apparatus comprising:
- projecting means for projecting the illumination beam to the first and second grating marks to produce a signal beam, through diffraction by the first and second grating marks, in a direction different from the direction in which the Fraunhofer diffraction beam is produced, to assure separation of the signal beam and the Fraunhofer diffraction beam at a position; and
- signal forming means comprising a sensor including a zone for detecting the signal beam and being disposed at the position where the signal beam is substantially separated from the Fraunhofer diffraction beam, said signal forming means comprising means for detecting the signal beam to produce a signal for aligning the mask and the wafer.

36. An apparatus according to claim 35, wherein said projecting means comprises means for obliquely projecting the illumination beam to the mark along a direction defining an azimuth angle with respect to a direction perpendicular to an edge of the mark, which edge at least partially defines the shape of the mark.

37. An apparatus according to claim 35, wherein said projecting means comprises means for projecting the illumination beam to the mark in such a direction to produce the signal beam in a direction different from the direction in which the Fraunhofer diffraction beam is produced from the pattern of the mark.

38. An apparatus according to claim 35, wherein the first and second grating marks have such optical powers that the position of incidence of the signal beam upon the detection zone displaces with the positional deviation.

39. An apparatus according to claim 38, wherein each of the first and second grating marks includes a zone plate pattern.

40. An apparatus according to claim 35, wherein the first and second grating marks have such patterns that the intensity of the signal beam upon the detection zone changes with the positional deviation.

* * * * *

UNITED STATES PATENT AND TRADEMARK OFFICE
CERTIFICATE OF CORRECTION

PATENT NO. : 5,325,176
DATED : June 28, 1994
INVENTOR(S) : Shigeyuki SUDA, et al.

It is certified that error appears in the above-indentified patent and that said Letters Patent is hereby corrected as shown below:

ON THE COVER PAGE:

UNDER "FOREIGN APPLICATION PRIORITY DATA":

"Sep. 6, 1988 [JP] Japan .... 53-225807" should read --Sept. 9, 1988 [JP] Japan .... 63-225807--.

IN THE DISCLOSURE:

COLUMN 1:

Line 13, "RELATED" should read --RELATED ART--.

COLUMN 3:

Line 61, "of," should read --of--; and
Line 63, "portion" should read --portion of--.

COLUMN 5:

Line 67, "$F_{i,j}-P_i\beta_j \cdot s_j | F_{i,j} | = r \cdot | P_i | = r$" should read:

--$F_{i,j} = P_i + \beta_j \cdot s_j$ $| F_{i,j} | = r \cdot | P_i | = r$--.

UNITED STATES PATENT AND TRADEMARK OFFICE
CERTIFICATE OF CORRECTION

PATENT NO. : 5,325,176
DATED : June 28, 1994
INVENTOR(S) : Shigeyuki SUDA, et al.

It is certified that error appears in the above-indentified patent and that said Letters Patent is hereby corrected as shown below:

COLUMN 6:

Line 3, "p" should read --$p_i$--;
Line 10, "z is" should read --(z is a--;
Line 18, "$U_2$ and $U_2$" should read --$U_1$ and $U_2$--; and
Line 51, "to     $_j$" should read --to $s_j$--.

COLUMN 9:

Line 49, "reflected" should read --reflection--.

COLUMN 10:

Line 5, "include" should read --includes--;
Line 10, "extending" should read --extending on--; and
Line 37, "descried" should read --described--.

COLUMN 14:

Line 51, "at" should read --at an--.

COLUMN 15:

Line 9, "is" should read --are--.

UNITED STATES PATENT AND TRADEMARK OFFICE
CERTIFICATE OF CORRECTION

PATENT NO. : 5,325,176

DATED : June 28, 1994

INVENTOR(S) : Shigeyuki SUDA, et al.

It is certified that error appears in the above-indentified patent and that said Letters Patent is hereby corrected as shown below:

COLUMN 20:

Line 31, "hexagonal," should read --hexagon,--.

COLUMN 22:

Line 46, "AE=2($d_0$+dG)tanθ1," should read --AE=2($d_0$+$d_G$)tanθ1,--.

COLUMN 23:

Line 11, "hexagonal" should read --hexagon--;
Line 40, "plate" should read --plates--; and
Line 68, "plate" should read --plates--.

COLUMN 24:

Line 32, "part FIGS. 25D." should read --FIG. 25D.--.

COLUMN 28:

Line 33, "as" should read --a--.

COLUMN 29:

Line 66, "substraters" should read --substrates--.

UNITED STATES PATENT AND TRADEMARK OFFICE
CERTIFICATE OF CORRECTION

PATENT NO. : 5,325,176
DATED : June 28, 1994
INVENTOR(S) : Shigeyuki SUDA, et al.

Page 4 of 4

It is certified that error appears in the above-indentified patent and that said Letters Patent is hereby corrected as shown below:

COLUMN 30:

Line 26, "the position" should read --a position--; and
    Line 28, "including" should read --includes--.

COLUMN 31:

Line 28, "ark" should read --mark--; and
    Line 32, "and" (second occurrence) should read --and--.

COLUMN 32:

Line 4, "positional" should read --position--.

Signed and Sealed this

Twenty-fourth Day of January, 1995

Attest:

BRUCE LEHMAN

*Attesting Officer*     *Commissioner of Patents and Trademarks*